(12) United States Patent
Van Wijmeersch

(10) Patent No.: US 9,882,375 B2
(45) Date of Patent: Jan. 30, 2018

(54) HIGH HOLDING VOLTAGE CLAMP

(71) Applicant: Sofics BVBA, Gistel (BE)

(72) Inventor: Sven Van Wijmeersch, Gistel (BE)

(73) Assignee: SOFICS BVBA, Gistel (BE)

(*) Notice: Subject to any disclaimer, the term of this patent is extended or adjusted under 35 U.S.C. 154(b) by 809 days.

(21) Appl. No.: 14/210,823

(22) Filed: Mar. 14, 2014

(65) Prior Publication Data
US 2014/0268451 A1  Sep. 18, 2014

Related U.S. Application Data

(60) Provisional application No. 61/792,282, filed on Mar. 15, 2013.

(51) Int. Cl.
*H02H 9/04* (2006.01)
*H01L 27/02* (2006.01)

(52) U.S. Cl.
CPC ......... *H02H 9/046* (2013.01); *H01L 27/0262* (2013.01)

(58) Field of Classification Search
CPC ............................ H02H 9/046; H01L 27/0262
See application file for complete search history.

(56) References Cited

U.S. PATENT DOCUMENTS

| | | | | |
|---|---|---|---|---|
| 5,400,202 A * | 3/1995 | Metz | ................... | H01L 27/0251 361/111 |
| 5,610,425 A * | 3/1997 | Quigley | .............. | H01L 27/0251 257/111 |
| 5,825,600 A * | 10/1998 | Watt | ..................... | H01L 27/0251 257/356 |
| 6,072,677 A * | 6/2000 | Chen | .................... | H01L 27/0251 361/111 |
| 6,236,087 B1 * | 5/2001 | Daly | .................... | H01L 27/0262 257/355 |
| 6,803,633 B2 * | 10/2004 | Mergens | ............. | H01L 27/0262 257/173 |
| 7,285,805 B1 * | 10/2007 | Vashchenko | ........ | H01L 27/0262 257/173 |
| 7,589,944 B2 * | 9/2009 | Mergens | ............. | H01L 27/0262 361/111 |
| 7,858,469 B1 * | 12/2010 | Watt | ..................... | H01L 27/0262 257/E21.618 |
| 9,042,065 B2 * | 5/2015 | Van Wijmeersch | ........ | H01L 27/0262 361/111 |
| 9,054,521 B2 * | 6/2015 | Huo | ....................... | H02H 9/046 |
| 9,705,318 B2 * | 7/2017 | Chaine | ................... | H02H 9/046 |
| 2002/0020880 A1 * | 2/2002 | Yu | ....................... | H01L 27/0255 257/360 |

(Continued)

FOREIGN PATENT DOCUMENTS

EP 2482314 A1 8/2012
WO 12119788 A1 9/2012

*Primary Examiner* — Stephen W Jackson
*Assistant Examiner* — Christopher Clark
(74) *Attorney, Agent, or Firm* — Volpe and Koenig, P.C.

(57) ABSTRACT

An electrostatic discharge (ESD) protection device with a high holding voltage is disclosed including at least an ESD clamp coupled to a holding voltage tuning circuit. The ESD clamp may be coupled to the holding voltage tuning circuit through a connection circuit such as a diode. The ESD clamp may be implemented by a first silicon controlled rectifier (SCR) and the holding voltage tuning circuit may be implemented as a second SCR.

24 Claims, 17 Drawing Sheets

(56) References Cited

U.S. PATENT DOCUMENTS

| | | | |
|---|---|---|---|
| 2002/0053704 A1* | 5/2002 | Avery | H01L 27/0255 257/361 |
| 2004/0100746 A1* | 5/2004 | Chen | H01L 27/0262 361/56 |
| 2005/0111150 A1* | 5/2005 | Jang | H01L 27/0262 361/56 |
| 2005/0275029 A1* | 12/2005 | Watt | H01L 29/87 257/355 |
| 2005/0286188 A1* | 12/2005 | Camp | H03K 17/08142 361/56 |
| 2006/0054974 A1 | 3/2006 | O et al. | |
| 2006/0125054 A1* | 6/2006 | Kim | H01L 27/0262 257/607 |
| 2007/0058307 A1* | 3/2007 | Mergens | H01L 29/7436 361/56 |
| 2007/0069310 A1* | 3/2007 | Song | H01L 29/7436 257/409 |
| 2008/0067602 A1 | 3/2008 | Tyler et al. | |
| 2010/0172059 A1* | 7/2010 | Chaine | H01L 27/0262 361/56 |
| 2012/0170160 A1* | 7/2012 | Wang | H01L 27/0262 361/56 |
| 2012/0275073 A1* | 11/2012 | Tsai | H02H 9/046 361/56 |
| 2014/0167099 A1* | 6/2014 | Mergens | H01L 29/87 257/109 |

\* cited by examiner

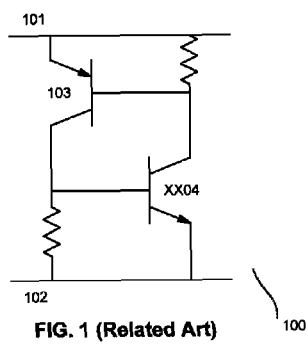
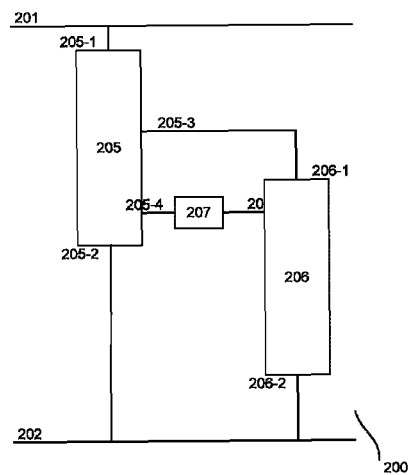
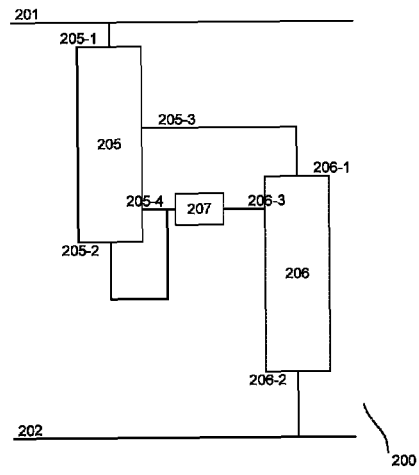
FIG. 1 (Related Art)
FIG. 2a
FIG. 2b

HIGH HOLDING VOLTAGE CLAMP

CROSS REFERENCE TO RELATED APPLICATION

This application claims the benefit of U.S. provisional application 61/792,282 filed Mar. 15, 2013, the contents of which are incorporated by reference as if fully set forth herein.

FIELD OF THE DISCLOSURE

The disclosure generally relates to Electrostatic Discharge (ESD) protection, latch up (LU), prevention, and prevention of damage during electrical overstress (EOS) conditions. More specifically, the disclosure relates to a method of protecting an integrated circuit (IC) against ESD damages, while maintaining high levels of LU robustness and EOS protection.

BACKGROUND

During ESD, large currents may flow through an IC which may potentially cause damage. Damage may occur within the device that conducts the current, as well as in devices that see a significant voltage drop due to the large current flow. To avoid damage due to an ESD event, clamps are added to the IC. These clamps may shunt the large ESD current without causing high voltage over sensitive nodes of the IC.

An example of an ESD clamp 100 is depicted in FIG. 1. The ESD clamp 100 comprises a silicon controlled rectifier (SCR) which may be formed by a PNP transistor 103 and an NPN transistor 104. This clamp may trigger from a well-to-well breakdown and may clamp at a low voltage such as 1V to 2V. The current caused by the avalanching the base-collector junction of the PNP 103 and collector-base junction of the NPN 104 may flow through the emitter-base of the PNP 103 and base emitter of the NPN 104. Positive feedback may be established, which may be the origin of the low holding voltage of the ESD clamp 100. Advantages of ESD clamp 100 may include a low clamping voltage, low on-resistance and a high failure current. However, ESD clamp 100 may shunt current during normal operating conditions, which may result in temporary loss of function. To restore normal operation, human or other IC interaction may be required. Further, if ESD clamp 100 triggers and enters into a low conductive (shunt) mode during normal operation, the energy of the current through the ESD clamp 100 may be too high such that temporary or permanent damage to the IC may occur. Such an increased (supply) current during normal operation, often caused by faulty triggering of the ESD clamp, may be called a latch up (LU) event.

A known way to overcome these issues may be to design ESD clamps with a high holding voltage. The holding voltage of the clamp may be the lowest voltage at which the device may sustain its high conductivity regime. By increasing the holding voltage above the supply level, the ESD clamp may be guaranteed to release from a latched/shunt state even if it is triggered during normal operation. As such, the loss of function may be temporary. Examples of such clamps include Zener diodes, and gate-grounded N-type metal oxide semiconductors (GGNMOS). These clamps may have a high clamping voltage but may also fail at a low current and their on-resistance may be high. Moreover, to comply with ESD requirements, a large chip area may be consumed to form these clamps.

A further requirement for an ESD protection clamp may include a low standby or leakage current. For some applications, the amount of capacitance added to the pad to which the ESD clamp is coupled may be minimized as well.

Therefore, there is a need for an improved ESD protection clamp, which combines the advantages of high and tunable holding voltage, low leakage, high and tunable trigger voltage, small silicon area for high current capability, and fast and effective triggering.

SUMMARY

An electrostatic discharge (ESD) protection device is disclosed. In one embodiment, the ESD protection device may be coupled between a first node and a second node. The ESD protection device may include an ESD clamp including a first anode, a first cathode, and a first control tap, wherein the first anode is coupled to the first node. The ESD protection device may further include a holding voltage tuning circuit including a second anode, a second cathode, and a first control node, wherein the second anode is coupled to the first control tap, and the second cathode is coupled to the second node. The ESD protection device may further include a connection circuit coupled between the first cathode and the first control node, wherein the ESD protection device may be configured to trigger during an ESD event to protect circuitry between the first node and the second node.

In another embodiment, the ESD protection device may include an ESD clamp including a first anode, a first cathode, and a first control tap, wherein the first cathode is coupled to the second node. The ESD protection device may further include a holding voltage tuning circuit including a second anode, a second cathode, and a first control node, wherein the second anode is coupled to the first node, and the second cathode is coupled to the first control tap. The ESD protection device may further include a connection circuit coupled between the first anode and the first control node, wherein the ESD protection device is configured to trigger during an ESD event to protect circuitry between the first node and the second node.

In another embodiment, the ESD clamp may include a first silicon controlled rectifier (SCR), the first SCR may include a first PNP transistor and a first NPN transistor, wherein the first SCR includes a first SCR anode acting as the first anode of the ESD clamp, a first SCR control tap acting as the first control tap of the ESD clamp, and a first SCR control tap acting as the first control tap of the ESD clamp In another embodiment, the holding voltage tuning circuit may include a second SCR, wherein the second SCR includes a second SCR anode acting as the second anode of the holding voltage turning circuit, a second SCR control tap acting as the second control tap of the holding voltage tuning circuit, and a second SCR control node acting as the first control node of the holding voltage tuning circuit In another embodiment, the connection circuit may include at least one diode.

In another embodiment, the ESD clamp may further include an additional trigger node, and the holding voltage tuning circuit may further include an additional control node, wherein the additional control node may be coupled to the additional trigger node.

In another embodiment, the ESD protection device may further include a first triggering device, wherein the ESD clamp further includes a first trigger tap, and wherein the first triggering device is coupled between the first node and a first trigger tap.

In another embodiment, the ESD protection device may further include a second triggering device, wherein the ESD clamp further includes a second trigger tap, and wherein the second triggering device is coupled between the second node and the second trigger tap.

In another embodiment, the ESD protection device may further include a first keep-off device, wherein the holding voltage tuning circuit further includes a trigger control node, and wherein the first keep-off device is coupled between the trigger control node and one of the first node or the second node.

In another embodiment, the first keep-off device may include at least one transistor.

In another embodiment, the ESD protection device may further include a second keep-off device, wherein the ESD clamp includes a second control tap, and wherein the second keep-off device is coupled between the second control tap and one of the first node or the second node.

In another embodiment, the ESD protection device may further include

In another embodiment, the second keep-off device may include at least one transistor.

In another embodiment, the ESD clamp may further include a second control tap, and the ESD protection device may further include a second holding voltage tuning circuit. The second holding voltage tuning circuit may include a third anode, a third cathode, and a second control node, wherein the third anode may be coupled to the first node, and the third cathode is coupled to the second control tap. The ESD protection device may further include a second connection circuit coupled between the second control node and the first anode.

In another embodiment, the ESD clamp may further include a second control tap, and the ESD protection device may further include a second holding voltage tuning circuit. The second holding voltage tuning circuit may include a third anode, a third cathode, and a second control node, wherein the third cathode is coupled to the second node, and the third anode is coupled to the second control tap. The ESD protection device may further include a second connection circuit coupled between the second control node and the first cathode.

In another embodiment, the holding voltage tuning circuit may include a MOS transistor, wherein the MOS transistor includes a drain acting as the second anode of the holding voltage tuning circuit, a source acting as the second cathode of the holding voltage tuning circuit, and a gate acting as the first control node of the holding voltage tuning circuit.

In another embodiment, the holding voltage tuning circuit may include a bipolar transistor, wherein the bipolar transistor includes a collector acting as the second anode of the holding voltage tuning circuit, an emitter acting as the second cathode of the holding voltage tuning circuit, and a base acting as the first control node of the holding voltage tuning circuit.

In another embodiment, the ESD protection device may further include one or more serially coupled diodes coupled from the first SCR cathode to the second node.

In another embodiment, the ESD protection device may further include one or more serially coupled diodes coupled from the first node to the first SCR anode.

BRIEF DESCRIPTION OF THE DRAWINGS

A more detailed understanding may be had from the following description, given by way of example in conjunction with the accompanying drawings wherein:

FIG. 1 is a schematic diagram of a typical ESD protection device.

FIG. 2a is a schematic diagram of an embodiment of an ESD protection device including a holding voltage tuning circuit.

FIG. 2b is a schematic diagram of another embodiment of an ESD protection device including a holding voltage tuning circuit.

DETAILED DESCRIPTION

Figure 3A:
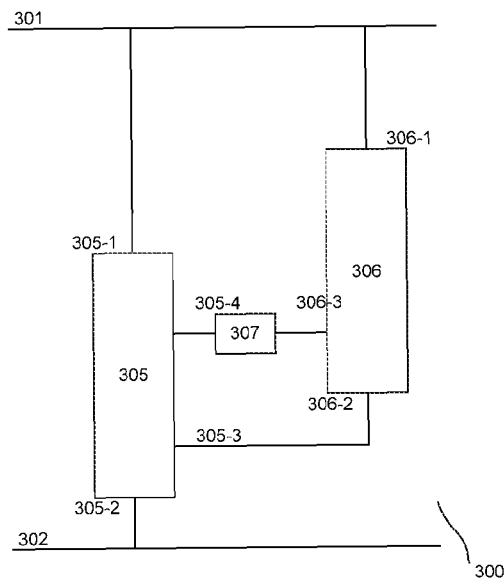
FIG. 3a is a schematic diagram of another embodiment of an ESD protection device including a holding voltage tuning circuit.

In the following descriptions, common numerical designations may be used for similar, corresponding parts across multiple figures. In general, the part number will start with the figure number. For instance, holding voltage tuning circuit 206 as shown in FIGS. 2a and 2b corresponds to similar holding voltage tuning circuit 406 and 506 shown in FIGS. 4 and 5, respectively. Likewise, ESD clamp 205 shown in FIGS. 2a and 2b corresponds to similar ESD clamp 305, 405, and 505 shown in FIGS. 3a, 4, and 5, respectively.

One of ordinary skill in the art should recognize a node, device, circuit, or region may be viewed as serving multiple functions. Furthermore, a node, device, circuit, or region may be referred to by different descriptions. For instance, node 201 and node 202 of FIGS. 2a and 2b may also be referred to as anode 201 and cathode 202, respectively. As another example, an ESD protection device may be interchangeably referred to as a clamp or ESD clamp. The numerical designation will provide an unambiguous notation for the node, device, circuit, or region under consideration while the preceding descriptor should aid the readability of the description in the context of the discussion.

Figure 12:
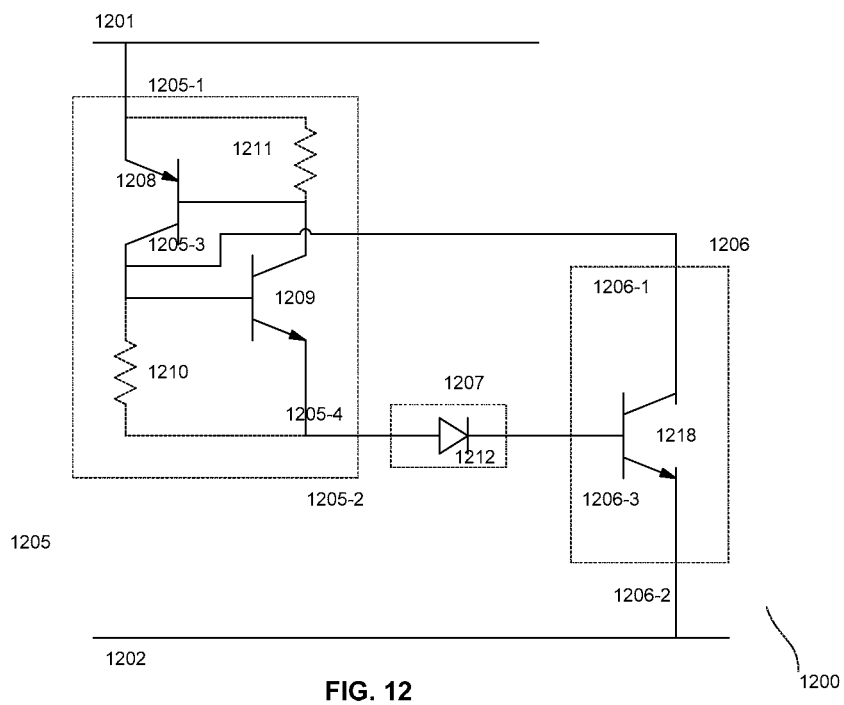
FIG. 12 is a schematic diagram of another embodiment of an ESD protection device including a holding voltage tuning circuit.

It is further important to note that though the embodiments depicted in the Figures and further described in the specification may be with respect to a particular arrangement or configuration of functional elements and/or including or excluding functional elements, one should recognize that the principles of the described and/or depicted embodiment may be applied to other embodiments such that embodiments not explicitly disclosed that are formed by a combination of the principles disclosed herein are within the scope of the description. For example, a FIG. 12 depicts an embodiment of an ESD protection device including an NPN transistor which may operate as a holding voltage tuning circuit wherein the cathode 1205-2 may be coupled to the second control tap 1205-4 or may be seen as the same as the second control tap 1205-4. One may recognize this arrangement may closely resemble that of the embodiment of the ESD protection device depicted generally in FIG. 2b. Nonetheless, one may apply the NPN transistor 1218 implementation of the holding voltage tuning circuit 1206 to the embodiment of the ESD protection device depicted in FIG. 2a. Similarly, the holding voltage tuning circuits 306 of FIGS. 3a and 3b may be implemented as bipolar transistors in accordance with the teachings of embodiment of FIG. 12. Furthermore, even though not explicitly depicted, one may, for instance, combine the diode connected metal oxide semiconductor (MOS) device 912 with the bipolar transistor 1218 taught in FIG. 12.

A first embodiment of an ESD protection device 200 having a high holding voltage is depicted in FIG. 2a. The ESD protection device 200 may comprise an ESD clamp 205, a holding voltage tuning circuit 206, and a connection circuit 207. The ESD clamp 205 may conduct the majority of the ESD current. The ESD clamp 205 may comprise four nodes: an anode 205-1 coupled to the anode 201 of the ESD protection device 200, a cathode 205-2 coupled to the cathode of the ESD protection device 200, a first control tap 205-3 to control the holding voltage of the ESD clamp 205 and a second control tap 205-4.

Another embodiment of an ESD protection device 200 having a high holding voltage is depicted in FIG. 2b. The cathode 205-2 and the second control tap 205-4 may be the same physical node in this case. The holding voltage tuning circuit 206 may comprise three nodes: an anode 206-1 coupled to the first control tap 205-3, a cathode 206-2 coupled to the cathode 202 of the ESD protection device 200, and a first control node 206-3 coupled to the connection circuit 207. The connection circuit 207 may be coupled between the second control tap 205-4 of the ESD clamp 205 and the first control node 206-3 of the holding voltage tuning circuit 206.

During an ESD event, the ESD clamp 205, for example the ESD clamp 205 of FIGS. 2a and 2b, may be triggered (internally or by an external trigger device not shown in the Figure). An internally triggered ESD clamp may include an additional junction placed inside the ESD clamp 205. An externally triggered ESD clamp may be triggered by a device that is not part of the ESD clamp 205 or inside of the clamp 205. The second control tap 205-4 may force a current or voltage to the first control node 206-3 of the holding voltage tuning circuit 206 through the connection circuit 207. When this voltage or current is detected by the holding voltage tuning circuit 206, anode 206-1 may pull the first control tap 205-3 of ESD clamp 205 to a lower voltage. The anode 206-1 pulling the first control tap 205-3 to a lower voltage may current immediately after detecting the voltage or current, or the pulling of the voltage may be delayed. Pulling the first control tap 205-3 to a lower voltage may make it difficult to keep the ESD clamp 205 on, such that the holding voltage of the ESD clamp 205 may increase. By pulling the first control tap 205-3 to a lower voltage, an electric field may be created which may prevent current flow from anode 205-1 to cathode 205-2. Also, a portion of current may be pulled out of the ESD clamp 205 so that this portion may not contribute to keep the ESD clamp on. The connection circuit 207 may be a short such that first control node 206-3 of the holding voltage tuning circuit 206 may be directly connected to the second control tap 205-4 or the connection circuit 207 may comprise one or more elements. The latter could be useful if the voltage at the first control tap 205-3 could not be pulled low enough. By placing additional elements for connection circuit 207, the voltage at the anode 206-1 of the tuning circuit 206 may be lower than the voltage at second control tap 205-4 (or the cathode 205-2 in FIG. 2b). Similarly, the voltage at the second control tap 205-4 (or the cathode 205-2 in FIG. 2b) may be higher than the voltage at first control tap 205-3.

Another embodiment of an ESD protection device is depicted in FIG. 3a. The ESD protection device 300 may comprise an ESD clamp 305, a holding voltage tuning circuit 306, and a connection circuit 307. The ESD clamp 305 may conduct the majority of the ESD current. The ESD clamp 305 may comprise four nodes: an anode 305-1 coupled to the anode 301 of the ESD protection device 300, a cathode 305-2 coupled to the cathode of the ESD protection device 300, a first control tap 305-3 to control the holding voltage of the ESD clamp 305 and a second control tap 305-4.

Figure 3B:
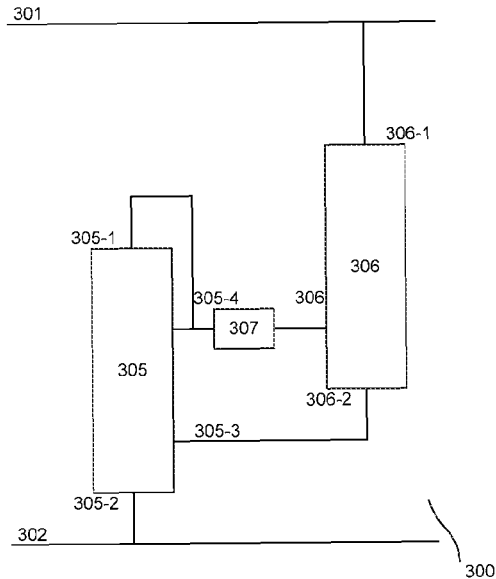
FIG. 3b is a schematic diagram of another embodiment of an ESD protection device including a holding voltage tuning circuit.

Another embodiment of an ESD protection device having a high holding voltage is depicted in FIG. 3b. The anode 305-1 and the second control tap 305-4 may be the same physical node in this case. The holding voltage tuning circuit 306 may comprise three nodes: an anode 306-1 coupled to the anode 301 of the ESD protection device 300, a cathode 306-2 coupled to the first control tap 305-3 of the ESD clamp 305, and a first control node 306-3 coupled to the connection circuit 307. The connection circuit 307 may be coupled between the second control tap 305-4 of the ESD clamp 305 and the first control node 306-3 of the holding voltage tuning circuit 306.

During an ESD event, the ESD clamp 305, for instance the ESD clamp 305 depicted in FIGS. 3a and 3b, may be triggered (internally or by an external trigger device not shown in the Figure). An internally triggered ESD clamp may include an additional junction placed inside the ESD clamp 205. An externally triggered ESD clamp may be triggered by a device that is not part of the ESD clamp 205 or inside of the clamp 205. The second control tap 305-4 may source a current or voltage from the first control node 306-3 of the holding voltage tuning circuit 306 through the connection circuit 307. When this voltage or current is detected by the holding voltage tuning circuit 306, cathode 306-2 may pull the first control tap 305-3 of ESD clamp 305 to a higher voltage. The cathode 306-2 pulling the first control tap 305-3 to a higher voltage may current immediately after detecting the voltage or current, or the pulling of the voltage may be delayed. Pulling the first control tap 305-3 to a higher voltage may make it difficult to keep the ESD clamp 305 on, such that that the holding voltage of the ESD clamp 305 may increase. By pulling the first control tap 305-3 to a higher voltage, an electric field may be created which may prevent current flow from anode 305-1 to cathode 305-2. Also, a portion of current may be forced into the ESD clamp 305 so that this portion may not contribute to keep the ESD clamp on. The connection circuit 307 may be a short such that first control node 306-3 of the holding voltage tuning circuit 306 may be directly connected to the second control tap 305-4 or the connection circuit 307 may comprise one or more elements. The latter could be useful if the voltage at the first control node 306-3 could not be pulled high enough. By placing additional elements for connection circuit 307, the voltage at the cathode 306-2 of the tuning circuit 306 may be higher than the voltage at second control tap 305-4 (or the cathode 305-2 in FIG. 3b). Similarly, the voltage at the second control tap 305-4 (or the cathode 305-2 in FIG. 3b) may be lower than the voltage at first control node 306-3.

Figure 4:
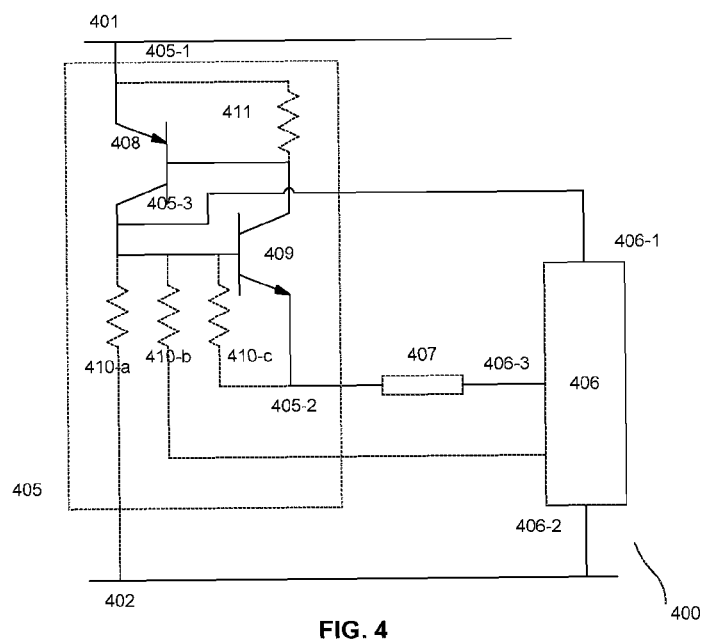
FIG. 4 is a schematic diagram of another embodiment of an ESD protection device including a holding voltage tuning circuit.

As shown in FIG. 4, in one embodiment the ESD clamp 405 may comprise a silicon controlled rectifier (SCR). The SCR may be formed by a PNP 408 and a NPN 409. The emitter of the PNP 408 may be coupled to the anode of the ESD clamp 405-1. The emitter of the NPN 409 may be coupled to the cathode 405-2. In this embodiment the second control tap 405-4 may be the same as the cathode 405-2 and thus not shown in FIG. 4. The ESD clamp 405 may also comprise a resistor 411 coupled between the base and the emitter of the PNP 408. This resistor may be an intrinsic well resistor, an explicitly placed resistor (like metal, poly or junction resistors) or a MOS transistor. The resistor 411 may also be left out. The ESD clamp 405 may also comprise a resistor 410 coupled between the base of the NPN 409 and any one of the emitter of the NPN 409 (represented as 410-c in FIG. 4), the voltage tuning circuit 406 (represented as 410-b in FIG. 4), or the cathode 402 (represented as 410-a in FIG. 4). This resistor may be an intrinsic well resistor, an explicitly placed resistor (like metal, poly or junction resistors) or a MOS transistor. The resistor 410 may also be left out. Note that a trigger device may also be added to turn on the SCR (not shown in FIG. 4).

During ESD, current may flow from anode 405-1 to cathode 405-2. This current may flow through the connection circuit 407 towards the first control node 406-3 of the holding voltage tuning circuit 406. When the holding voltage tuning circuit 406 receives this signal, it may pull the voltage at its anode 406-1 towards its cathode 406-2. The anode 406-1 may be coupled to the first control tap 405-3. The first control tap 405-3 may be coupled to a region inside the base region of the NPN 409. During ESD this node may be pulled towards the cathode 406-2. By pulling the node to a low voltage it may be more difficult to forward bias the base-emitter junction of the NPN 409. By making it more difficult to turn on the SCR, its holding voltage may increase. As such, a high holding voltage may be reached while maintaining the current capability of an SCR. One should recognize that an ESD protection device including an SCR functioning as an ESD clamp, such as ESD protection device 400, in accordance with the teachings of FIG. 4 may be combined with any of the other embodiments disclosed herein.

Figure 5:
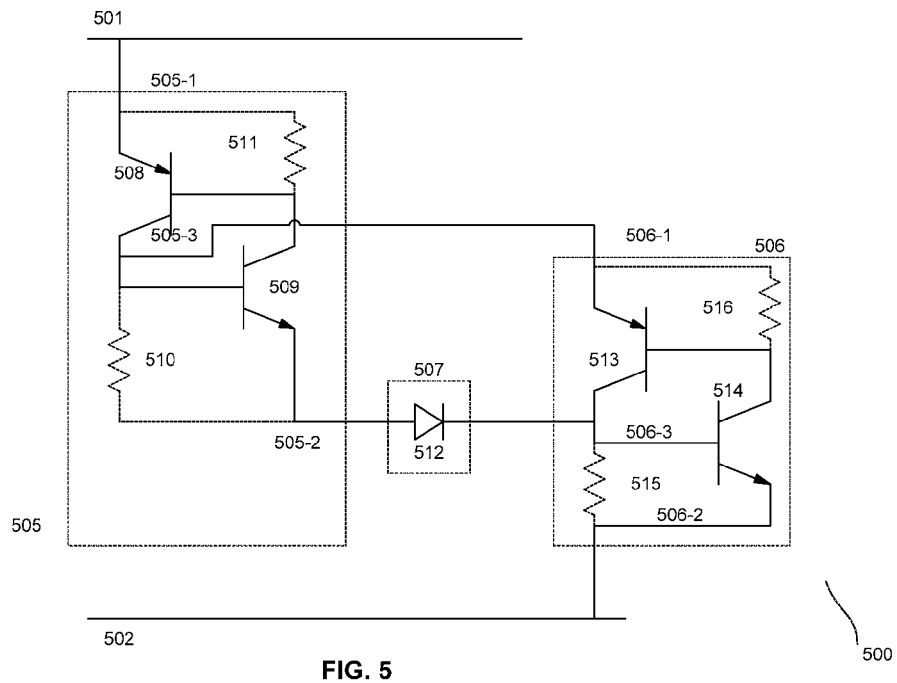
FIG. 5 is a schematic diagram of another embodiment of an ESD protection device including a holding voltage tuning circuit.

Another embodiment of an ESD protection device 500 having a high holding voltage is depicted in FIG. 5. The ESD clamp 505 may comprise an SCR. The connection circuit 507 may comprise a diode 512 and the holding voltage tuning circuit 506 may comprise a second SCR. The connection circuit 507 may also be a short or may be any other combination of elements. One should recognize that though the connection circuit of any of the embodiments herein may be depicted or described as a particular electrical element, the connection circuit may be replaced by a short or any other electrical element or combination of electrical elements. In general, any device that creates an appropriate voltage drop may be used. Resistors, transistors, inductors, diodes, capacitors, and other devices may be used in any combination. This second SCR may be formed by a PNP 513 and an NPN 514. The holding voltage tuning circuit 506 may also comprise a resistor 516 coupled between the base and the emitter of the PNP 513. Alternatively (not shown in the Figure), the resistor may be coupled to the anode 501. This resistor may be an intrinsic well resistor, an explicitly placed resistor (like metal, poly or junction resistors), or a MOS device. The resistor 516 may also be left out. The holding voltage tuning circuit 506 may also comprise a resistor 515 coupled between the base and the emitter of the NPN 514. This resistor may be an intrinsic well resistor, an explicitly placed resistor (like metal, poly or junction resistors) or a MOS transistor. The resistor 515 may also be left out.

The cathode 505-2 may have a voltage more than that of node 502 of 2*0.7V=1.4V (built-in voltage of the two diodes (approximately 0.7V per diode): diode 512 and the base-emitter diode of the NPN 514). To keep the ESD clamp 505 triggered, the base (mostly p-well) of the NPN 509 may be at 2.1V (3 diode drops) above node 502. The SCR of the holding voltage tuning circuit 506 may try to pull the voltage between the base of the NPN 509 and node 502 close to 1.2V, the characteristic holding voltage of an SCR. As current increases through ESD clamp 505, the voltage at the cathode 505-2 may rise, because the ESD clamp 505 forces the current it conducts through the series elements diode 512 and the base-emitter diode of the NPN 514. Also, the voltage at the base (mostly p-well) of the NPN 509 may drop as a result of the SCR of the holding voltage tuning circuit 506 drawing more current and pulling the voltage of the base of the NPN 509 towards the cathode 502. The net effect may be that at least a part of the base-emitter junction of the NPN 509 may be reverse biased. Pulling the voltage at the base of 509 below the voltage at the emitter (cathode 505-2) may create an electric field that may prevent injected minority carriers from reaching the collector of the NPN 509.

The holding voltage tuning circuit 506 may not control the p-well base of the NPN 509 perfectly. It may be possible for the voltage at the actual p-well/cathode (base-emitter) junction of NPN 509 to be different from the voltage at the first control node 506-3. If the PNP 508 injects enough current into the p-well base of NPN 509, the p-well/cathode junction of NPN 509 may become forward biased enough to turn on the SCR of the ESD clamp 505. However, this may require high currents through the PNP 508 collector, and relatively high injection into the base of NPN 509 from the emitter of NPN 509. Since the gain, and thus the collector current, of the both the PNP 508 and NPN 509 may increase with the base-emitter voltage, a minimum voltage may be required over the SCR of the ESD clamp 505 before it may start conducting. This minimum voltage may be the holding voltage. The exact holding voltage may depend on the (transfer-) resistance between p-well/cathode junction (base-emitter junction of NPN 509) and p-well tap (first control tap 503-3), and also on the trigger/holding current and on-resistance of the holding voltage tuning circuit 506. One should recognize that an ESD protection device including an SCR functioning as holding voltage tuning circuit, such as ESD protection device 500, in accordance with the teachings of FIG. 5 may be combined with any of the other embodiments disclosed herein.

As shown in the embodiment depicted in FIG. 5, the connection circuit 507 may comprise at least one diode 512. This diode 512 may be added to increase the voltage at the cathode 505-2. By increasing this voltage at the cathode 505-2 the clamping voltage of 506 may be higher to still pull the first control tap 505-3 below the cathode 505-2.

Figure 6:
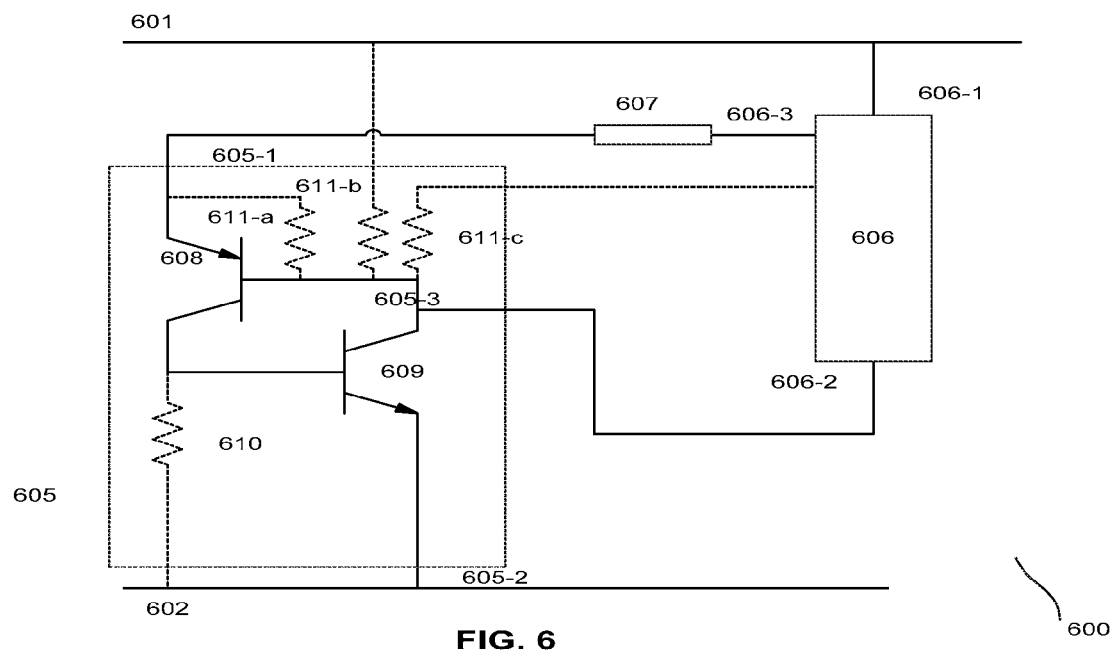
FIG. 6 is a schematic diagram of another embodiment of an ESD protection device including a holding voltage tuning circuit.

Another example of an embodiment of an ESD protection device 600 having a high holding voltage is depicted in FIG. 6. Cathode 605-2 of ESD clamp 605 may be coupled to node 602. Anode 605-1 of ESD clamp 605 may be coupled to first control node 606-3 through connection circuit 607. First control tap 605-3 may be coupled to cathode 606-2 of holding voltage tuning circuit 606. Anode 606-1 of holding voltage tuning circuit 606 may be coupled to node 601. The ESD clamp 605 may also comprise a resistor 611 coupled between the base of the PNP 608 and any one of the emitter of the PNP 608 (represented as 611-*a* in FIG. 6), the voltage tuning circuit 606 (represented as 611-*c* in FIG. 6), or the anode 601 of the ESD protection device 600 (represented as 611-*b* in FIG. 6). This resistor may be an intrinsic well resistor, an explicitly placed resistor (like metal, poly, or junction resistor) or a MOS transistor. The resistor may also be left out. The ESD clamp 605 may also comprise a resistor 610 coupled between the base and the emitter of the NPN 609. This resistor may be an intrinsic well resistor, an explicitly placed resistor (like metal, poly or junction resistor) or a MOS transistor. The resistor 610 may also be left out.

During ESD, current may flow from anode 605-1 to cathode 605-2. This current may flow through the connection circuit 607 from the first control node 606-3 of the holding voltage tuning circuit 606. When the holding voltage tuning circuit 606 receives this signal, it may pull the voltage at its cathode 606-2 towards its anode 606-1. The cathode 606-2 may be coupled to the first control tap 605-3. The first control tap 605-3 may be coupled to a region inside the base region of the PNP 608. During ESD this node may be pulled towards the anode 606-1. By pulling the node to a high voltage it may be more difficult to forward bias the base-emitter junction of the PNP 608. By making it more difficult to turn on the SCR, its holding voltage may increase. So a high holding voltage may be reached with the current capability of an SCR. One should recognize that an ESD protection device including an SCR functioning as an ESD clamp, such as ESD protection device 600, in accordance with the teachings of FIG. 6 may be combined with any of the other embodiments disclosed herein.

Figure 7:
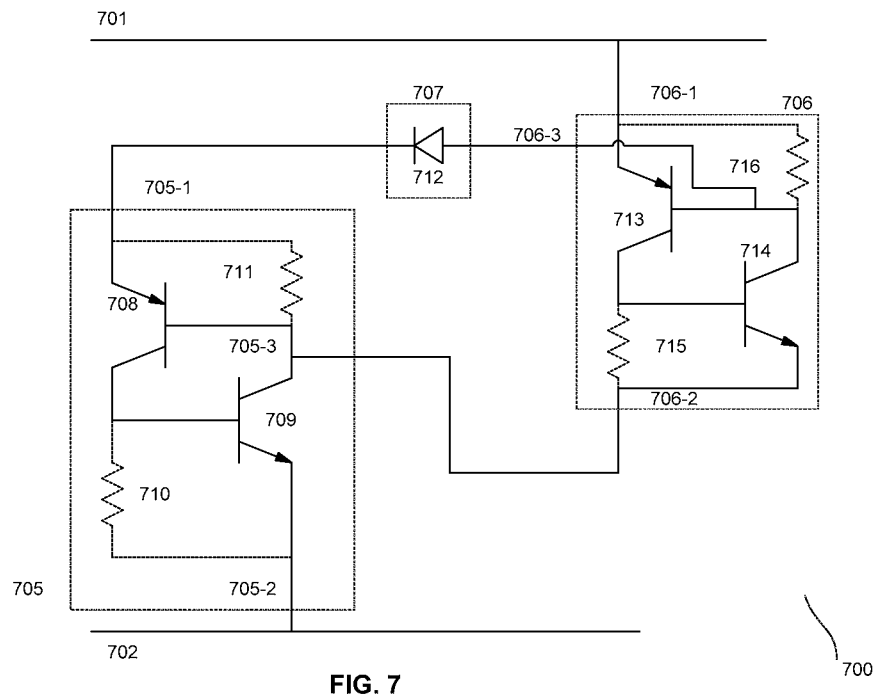
FIG. 7 is a schematic diagram of another embodiment of an ESD protection device including a holding voltage tuning circuit.

Another embodiment of an ESD protection device 700 having a high holding voltage is depicted in FIG. 7. The ESD clamp 705 may comprise an SCR. The connection circuit 707 may comprise a diode 712 and the holding voltage tuning circuit 706 may comprise a second SCR. This second SCR may be formed by a PNP 713 and an NPN 714.

The holding voltage tuning circuit 706 may also comprise a resistor 716 coupled between the base and the emitter of the PNP 713. This resistor may be an intrinsic well resistor, an explicitly placed resistor (like metal, poly or junction resistors), or a MOS device. The resistor 716 may also be left out. The holding voltage tuning circuit 706 may also comprise a resistor 715 coupled between the base and the emitter of the NPN 714. This resistor may be an intrinsic well resistor, an explicitly placed resistor (like metal, poly or junction resistors) or a MOS transistor. The resistor 715 may also be left out.

The anode 705-1 may have a voltage less than that of node 701 by a voltage drop of 2*0.7V=1.4V (built-in voltage of the two diodes (approximately 0.7 per diode): diode 712 and the emitter-base diode of the PNP 713. To keep the ESD clamp 705 triggered, the base (mostly n-well) of the PNP 708 may be at 2.1V (3 diode drops) below node 701. The SCR of the holding voltage tuning circuit 706 may try to pull the voltage between node 701 and the base of the PNP 708 to close to 1.2V, the characteristic holding voltage of an SCR. As current increases through ESD clamp 705, the voltage at the anode 705-1 may drop, because the ESD clamp 705 forces the current it conducts through the series elements diode 712 and the emitter-base diode of the PNP 713. Also, the voltage at the base (mostly n-well) of the PNP 708 may rise as a result of the SCR of the holding voltage tuning circuit 706 sourcing more current and pulling the base of the PNP 708 towards the anode 701. The net effect may be that at least a portion of the emitter-base junction of the PNP 708 may be reverse biased. Pulling the voltage at the base of 708 above the voltage at the emitter (anode 705-1) may create an electric field that may prevent injected minority carriers from reaching the collector of the PNP 708.

The holding voltage tuning circuit 706 may not control the n-well base of the PNP 708 perfectly. It may be possible for the voltage at the actual anode/n-well (emitter-base) junction of PNP 708 to be different from the voltage at the first control node 706-3. If the NPN 709 injects enough current into the n-well base of PNP 708, the anode/n-well junction of PNP 708 may become forward biased enough to turn on the SCR of the ESD clamp 705. However, this may require high currents through the NPN 709 collector, and relatively high injection into the base of PNP 708 from the emitter of PNP 708. Since the gain, and thus the collector current, of the both the PNP 708 and NPN 709 may increase with the emitter-base voltage, a minimum voltage dropped over the SCR of the ESD clamp 705 may be required before it may start conducting. This minimum voltage may be the holding voltage. The exact holding voltage may depend on the (transfer-) resistance between anode/n-well junction (emitter-base junction of PNP 708) and n-well tap (first control tap 705-3), and also on the trigger/holding current and on-resistance of the holding voltage tuning circuit 706. One should recognize that an ESD protection device including an SCR functioning as holding voltage tuning circuit, such as ESD protection device 700, in accordance with the teachings of FIG. 7 may be combined with any of the other embodiments disclosed herein.

As shown in the embodiment depicted in FIG. 7, the connection circuit 707 may comprise at least one diode 712. This diode 712 may be added to decrease the voltage at the anode 705-1. By decreasing this voltage at the anode 705-1 the clamping voltage across 706 may be higher to still pull the first control tap 705-3 above the anode 705-1.

Figure 8:
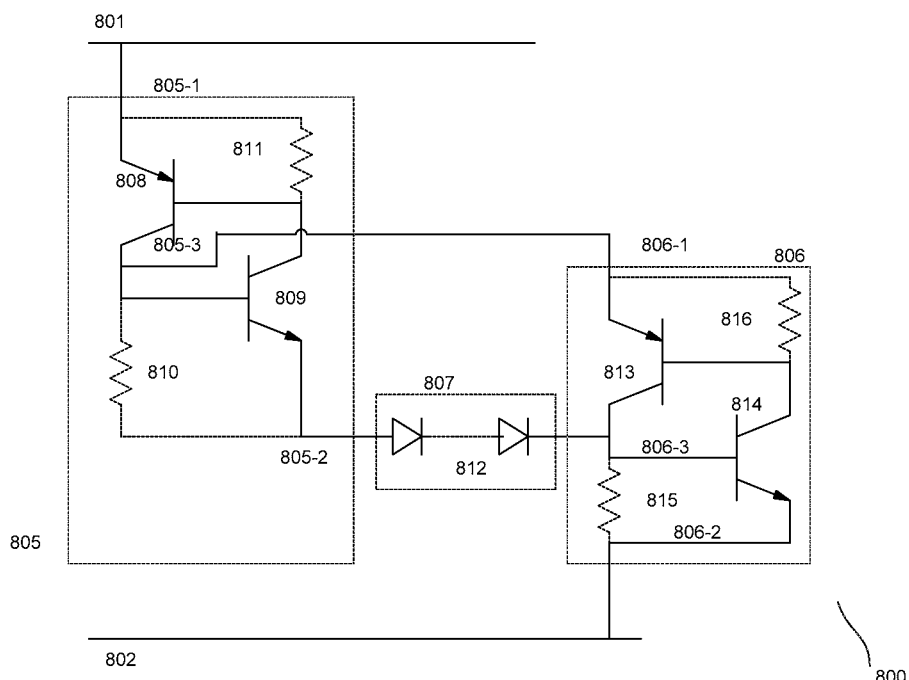
FIG. 8 is a schematic diagram of another embodiment of an ESD protection device including a holding voltage tuning circuit.
Figure 9:
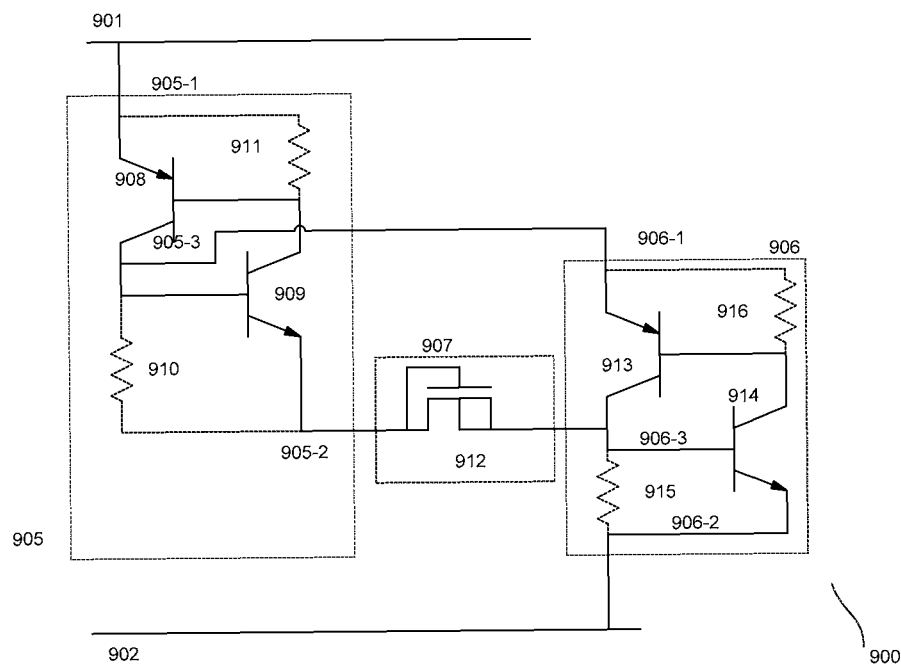
FIG. 9 is a schematic diagram of another embodiment of an ESD protection device including a holding voltage tuning circuit.

As similarly explained above, connection circuit 807 may create the potential difference to increase the holding voltage of the ESD clamp 805. FIG. 8 illustrates yet another embodiment of an ESD protection device. As shown in FIG. 8, connection circuit 807 may comprise, for example, more than one diode. As another example, in the embodiment of an ESD protection device 900 depicted in FIG. 9, the connection circuit 907 may comprise a MOS 912 configured in a diode-coupled configuration (gate of the MOS 912 coupled to the drain of the MOS 912). Alternatively, the gate of MOS 912 may be coupled to the source of MOS 912, or the bulk of MOS 912 may be coupled to the drain of MOS 912. In general, any device that creates an appropriate voltage drop may be used. Resistors, transistors, inductors, diodes, capacitors, and other devices may be used in any combination. One should recognize that an ESD protection device including a series of diodes 812 functioning as connection circuit 807, such as in ESD protection device 800 in FIG. 8, or an ESD protection device including a diode connected MOS 917 functioning as connection circuit 907, such as in ESD protection device 900 in FIG. 9, may be combined with any of the other embodiments disclosed herein.

Figure 10:
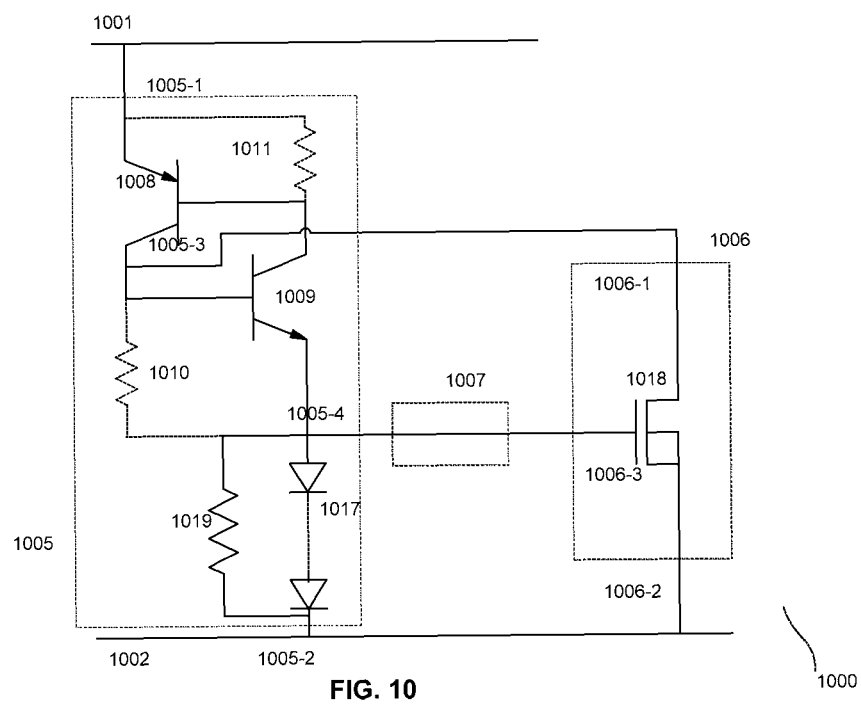
FIG. 10 is a schematic diagram of another embodiment of an ESD protection device including a holding voltage tuning circuit.

Instead of an SCR, the holding voltage tuning circuit 1006 may comprise other elements. FIG. 10 depicts another embodiment of an ESD protection device 1000, wherein the holding voltage tuning circuit 1006 comprises a MOS transistor 1018. The MOS transistor 1018 may be an NMOS as depicted in FIG. 10 but may alternatively be a PMOS. The MOS 1018 may be a low voltage MOS device or a high voltage MOS device. The type of MOS is not limited by the required holding voltage of the ESD protection device 1000. The drain of MOS transistor 1018 may be coupled to the anode 1006-1, the source/bulk of MOS transistor 1018 may be coupled to the cathode 1006-2 and the gate of MOS transistor 1018 may be coupled to the first control node 1006-3. The ESD clamp 1005 may comprise an SCR formed by the PNP 1008 and the NPN 1009. Element 1017 may comprise one or more serially-coupled diodes. Element 1017 may be coupled between the emitter of NPN 1009 and the cathode 1005-2. The emitter of the NPN 1009 may be coupled to the second control tap 1005-4. In one embodiment, the connection circuit 1007 may be a metal connection. It is noted that the connection circuit 1007 may comprise other elements as discussed above. For example, the connection circuit 1007 may comprise a resistor, and/or some extra gate protection circuits between the gate and source of the MOS 1018 (not depicted in the Figure). The gate protection circuits may comprise a Zener diode, capacitor, MOS, bipolar, . . . . During ESD, current may flow through the SCR of ESD clamp 1005 and through element 1017 of the ESD clamp 1005. A voltage drop may be created over element 1017. This voltage may be transferred to the first control node 1006-3 of the holding voltage tuning circuit 1006 through the connection circuit 1007. This voltage may forward bias the gate-source junction of the MOS transistor 1018, turning it on which may cause the drain to be pulled to the source. A similar mechanism as described above may increase the holding voltage of the SCR of the ESD clamp 1005. The ESD clamp may also comprise a resistive element 1019 coupled in parallel with element 1017. This resistive element 1019 may be used to pull the second control node 1005-4 towards the cathode 1005-2 to prevent high leakage during normal operation. The resistor 1019 may also be removed, or may be replaced by another resistive element like a MOS device, bipolar transistor, inductor, capacitor, etc. One should recognize that an ESD protection device including diodes such as diodes 1017 and/or resistive element 1019, in accordance with the teachings of FIG. 10, may be combined with any of the other embodiments disclosed herein. Furthermore, one should recognize that an ESD protection device including a MOS device 1018 functioning as a holding voltage tuning circuit 1006, in accordance with the teachings of FIG. 10, may be combined with any of the other embodiments disclosed herein. Furthermore, one should recognize that the MOS device 1018 may be NMOS or PMOS.

Figure 11:
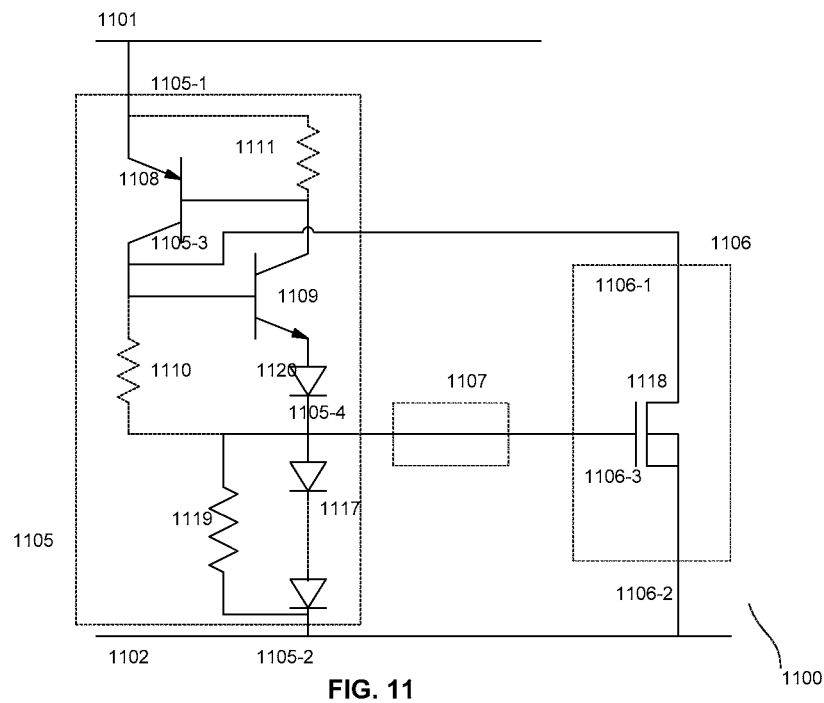
FIG. 11 is a schematic diagram of another embodiment of an ESD protection device including a holding voltage tuning circuit.

FIG. 11 shows another embodiment of an ESD protection device 1100 having a high holding voltage, wherein the ESD clamp 1105 further comprises element 1120. Though FIG. 11 depicts element 1120 as a diode, element 1120 may also be a resistor, MOS transistor, a bipolar transistor, or any serial combination thereof. Furthermore, two or more MOS devices 1118 may be placed in parallel. In such an example, the element 1120 may also comprise two or more elements, such as two or more diodes. The respective gate of each MOS device 1118 may be connected to a different node in the serial chain of diodes, such that a diode may be coupled between each gate. One should recognize that an ESD protection device including an element such as element 1120, in accordance with the teachings of FIG. 11, may be combined with any of the other embodiments disclosed herein.

FIG. 12 depicts another embodiment of an ESD protection device 1200 having a high holding voltage, wherein the holding voltage tuning circuit 1206 may comprise a bipolar transistor 1218. The emitter of the NPN 1218 may be coupled to the cathode 1206-2, the collector may be coupled to the anode 1206-1, and the base may be coupled to the first control node 1206-3. One should recognize that an ESD protection device including a bipolar transistor 1218 functioning as a holding voltage tuning circuit 1206, in accordance with the teachings of FIG. 12, may be combined with any of the other embodiments disclosed herein. Furthermore, one should recognize that a PNP transistor may be used instead of or in addition to NPN transistor 1218.

Figure 13:
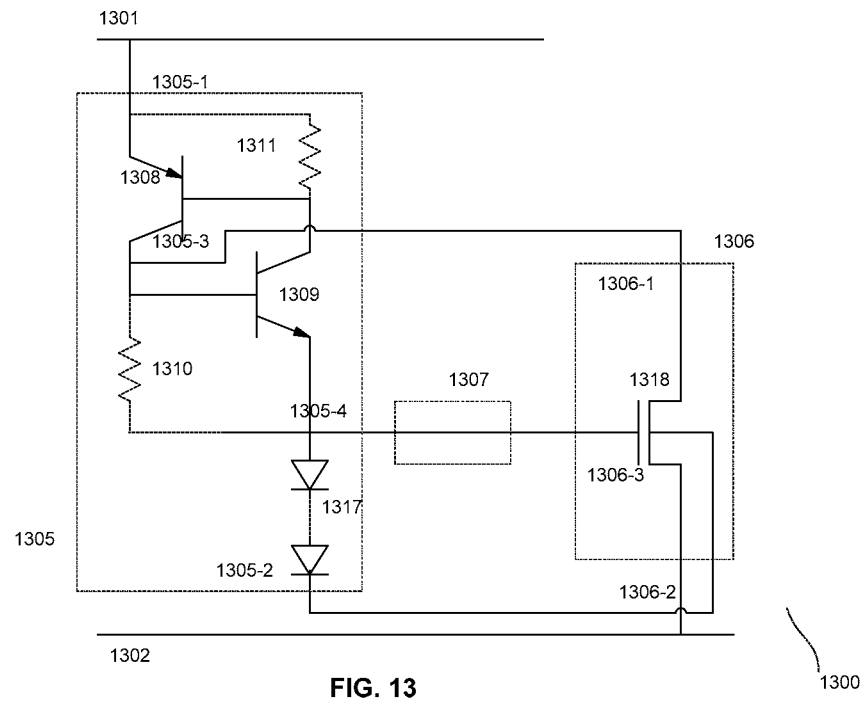
FIG. 13 is a schematic diagram of another embodiment of an ESD protection device including a holding voltage tuning circuit.

FIG. 13 shows another embodiment of an ESD protection device 1300 having a high holding voltage, wherein the holding voltage tuning circuit 1306 may comprise a MOS transistor 1318. MOS transistor 1318 may configured in at least 2 ways. One configuration may be as depicted in FIG. 10, wherein the bulk and source of 1318 are coupled together. In another configuration, as depicted by way of example in FIG. 13, the cathode 1305-2 may be coupled to the bulk of the MOS transistor 1318. Coupling the cathode 1305-2 to the bulk of the MOS transistor 1318 may cause the current through the ESD clamp 1305 to also flow through the bulk of MOS 1318. This current may turn on a bipolar formed by the drain, bulk and source of MOS 1318. This second configuration may operate similarly to that of the bipolar transistor 1218 depicted in FIG. 12. One should recognize that an ESD protection device including a MOS transistor 1318 functioning as a holding voltage tuning circuit 1306 with its bulk coupled to diodes 1317, in accordance with the teachings of FIG. 13, may be combined with any of the other embodiments disclosed herein.

Figure 14:
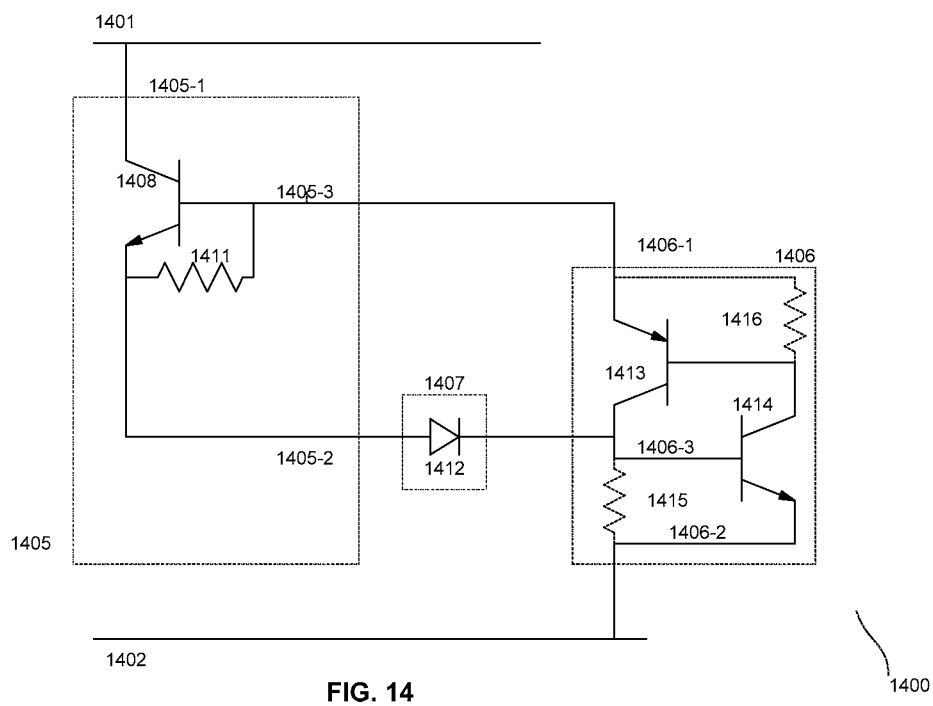
FIG. 14 is a schematic diagram of another embodiment of an ESD protection device including a holding voltage tuning circuit.

The ESD clamp 1305 is not limited to a certain type of SCR, different types of SCRs as known by those skilled in the art may be used. Furthermore, the ESD clamp 1305 may comprise other elements instead of an SCR. One example may be as shown in FIG. 14. The ESD clamp 1405 may comprise an NPN 1408. The collector may be coupled to the anode 1405-1, and the emitter may be coupled to the cathode 1405-2. The first control tap 1405-3 may be coupled to a region inside the base of the NPN 1408. A resistor 1411 may also be added between the base and collector. This resistor 1411 may be an intrinsic well resistance or an externally placed resistor. This resistor may also be left out. Though FIG. 14 depicts NPN 1408, a PNP or other elements like a MOS transistor, etc. may be used. One should recognize that an ESD protection device including an ESD clamp that may not be an SCR, such as bipolar transistor 1408, in accordance with the teachings of FIG. 14, may be combined with any of the other embodiments disclosed herein.

Figure 15A:
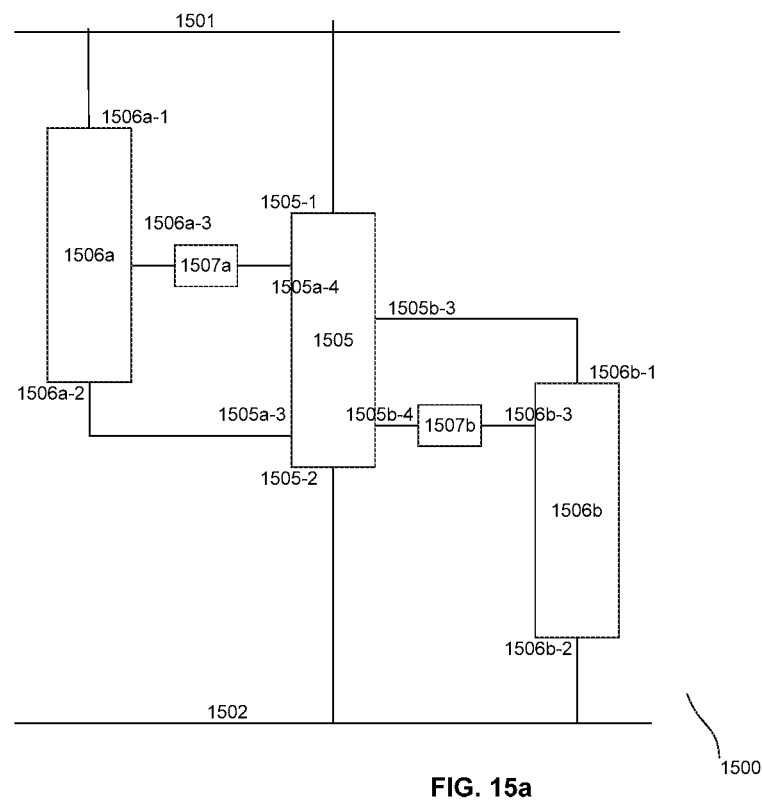
FIG. 15a is a schematic diagram of another embodiment of an ESD protection device including two holding voltage tuning circuits.
Figure 15B:
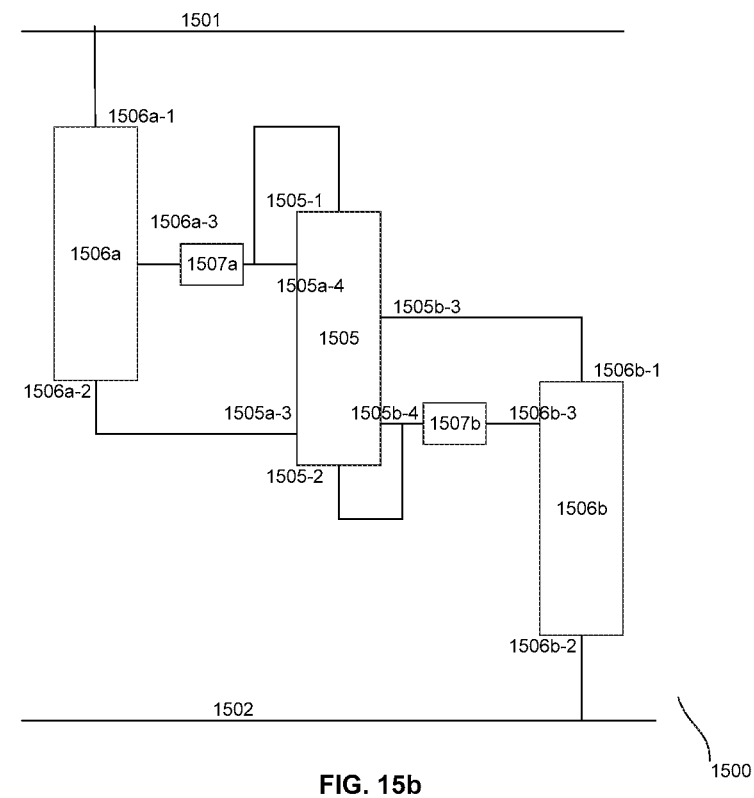
FIG. 15b is a schematic diagram of another embodiment of an ESD protection device including two holding voltage tuning circuits.

FIGS. 15a and 15b depict further embodiments of an ESD protection device 1500 having a high holding voltage, wherein multiple holding voltage tuning circuits 1506 may be used. FIGS. 15a and 15b show example embodiments comprising 2 holding voltage tuning circuits 1506a and 1506b. The example embodiments shown also comprise 2 connection circuits 1507a and 1507b. One should recognize that an ESD protection device including multiple holding voltage tuning circuits, such as those depicted in FIGS. 15a and 15b, may be combined with any of the other embodiments disclosed herein.

Figure 16:
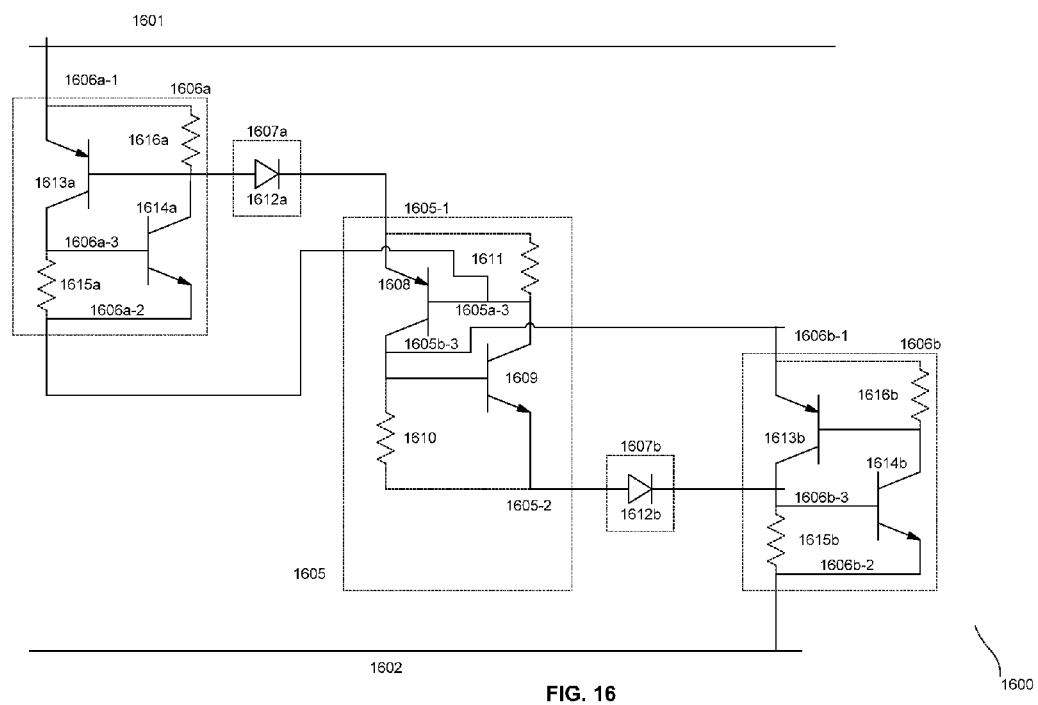
FIG. 16 is a schematic diagram of another embodiment of an ESD protection device including two holding voltage tuning circuits.

FIG. 16 shows an example of an implementation of the embodiment of an ESD protection device 1500 shown in FIG. 15b. In FIG. 16, the holding voltage tuning circuit 1606a comprises a first SCR, the holding voltage tuning circuit 1606b comprises a second SCR, and the ESD clamp 1605 comprises a third SCR. Operation of the high holding voltage protection circuit 1600 may follow the teachings as similarly set forth for the embodiments described above. One should recognize that ESD protection device 1500 shown in FIG. 15a may also be implemented similarly as shown in FIG. 16. Moreover, one should recognize that an ESD protection device including multiple SCR holding voltage tuning circuits, in accordance with the teachings of FIG. 16, may be combined with any of the other embodiments disclosed herein.

Figure 17A:
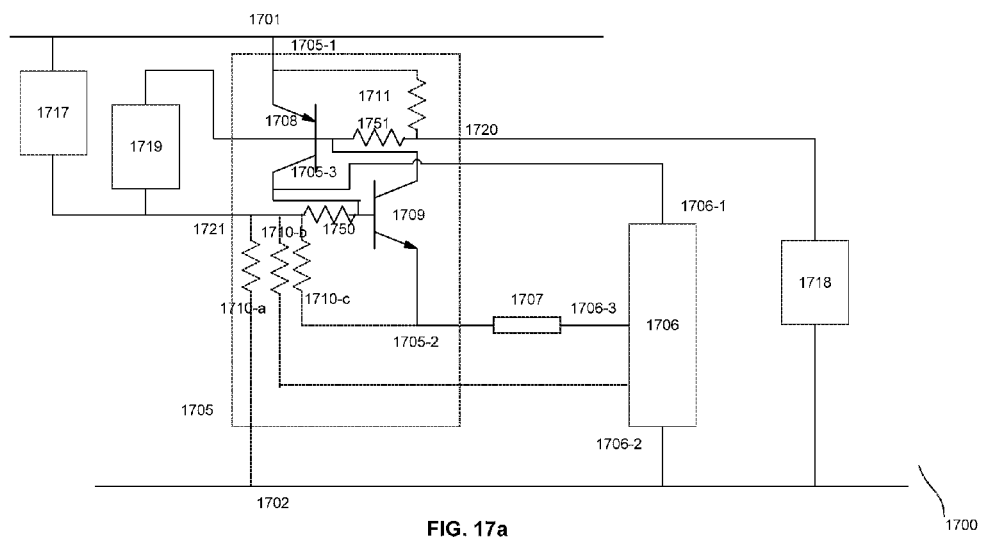
FIG. 17a is a schematic diagram of another embodiment of an ESD protection device including a holding voltage tuning circuit and additional triggering devices.

One or more additional trigger circuits to trigger a high holding voltage ESD protection device may be present in any of the embodiments disclosed herein. FIG. 17a depicts some examples of ways a trigger device may be configured. The trigger device 1717 may be coupled from the anode 1701 to a G1 trigger tap (formed in the base well of the NPN 1709) as shown in FIG. 17a. The trigger could also be coupled from the anode 1701 to the first control tap 1705-3. Another possibility may be to couple the trigger device 1718 from the G2 trigger tap (formed in the base well of the PNP 1708) to cathode 1702 as shown in FIG. 17a. Another possibility may be to couple the trigger device 1719 from the G2 trigger tap to the G1 trigger tap as shown in FIG. 17a. Though FIG. 17a depicts 3 possible ways to trigger the ESD clamp 1700, only one or two of the three trigger devices 1717, 1718 and 1719 may be present. The trigger devices 1717, 1718 or 1719 may comprise, for example, a Zener diode, a reverse diode, a MOS transistor, or a bipolar transistor to tune the trigger voltage. Instead of or in addition to a separate trigger device 1717, 1718, or 1719, the ESD clamp 1705 may be triggered internally. For example, an additional junction may be placed over the n-well/p-well junction to tune the reverse breakdown voltage of this junction. One should recognize that an ESD protection device including an ESD clamp that is not an SCR may be similarly triggered in accordance with the principles taught herein with respect to FIG. 17a and may be combined with any of the other embodiments described herein.

Figure 17B:
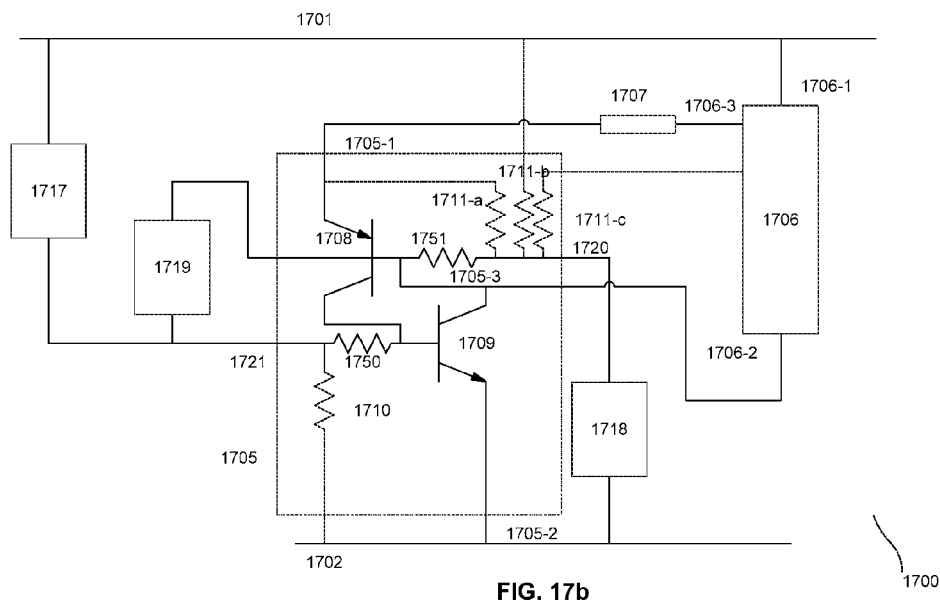
FIG. 17b is a schematic diagram of another embodiment of an ESD protection device including a holding voltage tuning circuit and additional triggering devices.

FIG. 17b depicts some additional examples of ways a trigger device may be configured. The trigger device 1718 may be coupled from a G2 tripper tap (formed in the base well of the PNP 1708) to the cathode 1702 as shown in FIG. 17b. The trigger could also be coupled from the first control tap 1705-3 to the cathode 1702. Another possibility may be to couple the trigger device 1717 from the anode 1701 to the G1 trigger tap (formed in the base well of the NPN 1709) as shown in FIG. 17b. Another possibility may be to couple the trigger device 1719 from the G2 trigger tap to the G1 trigger tap as shown in FIG. 17b. Though FIG. 17b depicts 3 possible ways to trigger the ESD clamp 1700, only one or two of the three trigger devices 1717, 1718 and 1719 may be present. The trigger devices 1717, 1718 or 1719 may comprise, for example, a Zener diode, a reverse diode, a MOS transistor, or a bipolar transistor to tune the trigger voltage. Instead of or in addition to a separate trigger device 1717, 1718, or 1719, the ESD clamp 1705 may be triggered internally. For example, an additional junction may be placed over the n-well/p-well junction to tune the reverse breakdown voltage of this junction. Resistances 1750 and 1751 as depicted in FIGS. 17a and 17b may be intrinsic well resistances formed between the base of the NPN or PNP transistor and the respective G1 or G2 trigger tap. FIGS. 18a, 18b, 19a, and 19b provide further details on said resistances. One should recognize that an ESD protection device including an ESD clamp that is not an SCR may be similarly triggered in accordance with the principles taught herein with respect to FIG. 17b and may be combined with any of the other embodiments described herein.

Figure 17C:
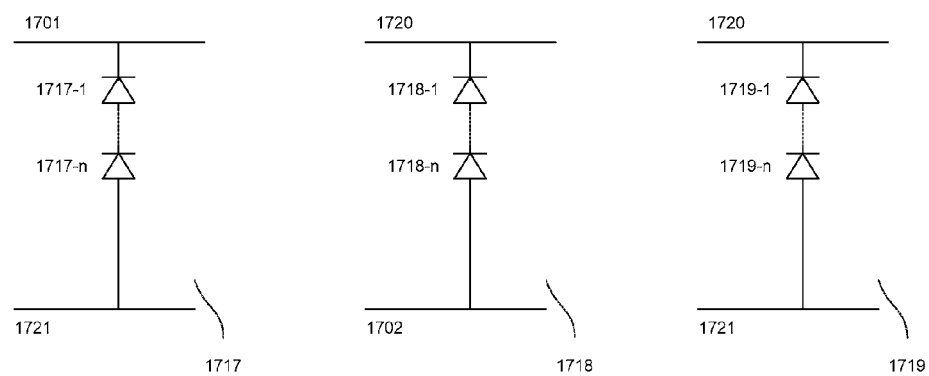
FIG. 17c are schematic diagrams of example triggering devices including a serial chain of diodes.

FIG. 17c depicts an examples of external trigger devices 1717, 1718, and 1719. Each external trigger device may comprise a series of diodes. For example, external trigger device 1717 may comprise a series of reverse diodes 1717-1 through 1717-n, wherein n may be any positive integer. The sum reverse breakdown voltage of the of the series of reverse diodes 1717-1 through 1717-n, for example, may determine the trigger voltage of the external trigger device 1717. Though the each of external trigger devices 1717, 1718, and 1719 are depicted as comprising n reverse diodes, the external trigger devices may each have a different number of reverse diodes. Furthermore, one should recognize the series of reverse diodes is merely an example and any device or combination of devices suitable for triggering may be used.

Figure 17D:
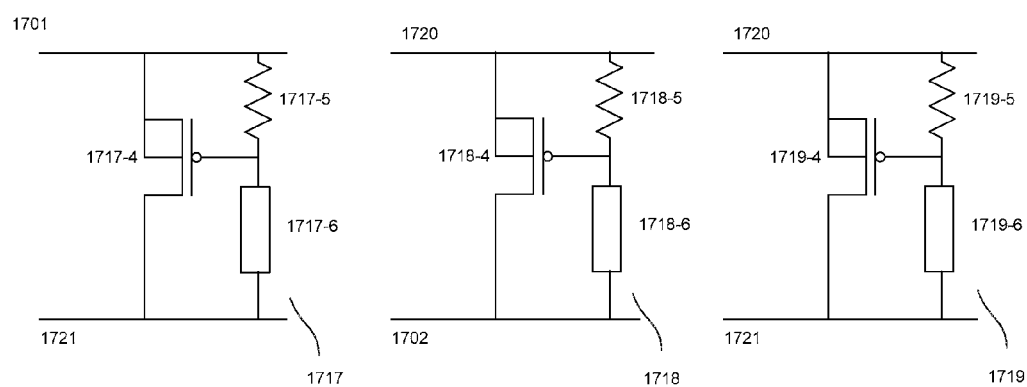
FIG. 17d are schematic diagrams of example triggering devices including a transistor.

FIG. 17d depicts additional examples of external trigger devices 1717, 1718, and 1719. For example, external trigger device 1717 may comprise transistor 1717-4. Transistor 1717-4 is depicted as a PMOS transistor, but it may also be implemented as an NMOS transistor or a combination of transistors of any type. The gate of transistor 1717-4 may be coupled to a resistor 1717-5 and a triggering device 1717-6. The triggering device 1717-6 may include the circuit depicted in FIG. 17c. When the triggering device 1717-6 turns on, current may flow through the resistor 1717-5, which may turn on the transistor 1717-4. If an NMOS transistor is used instead of the PMOS transistor 1717-4 depicted, the resistor 1717-5 may be coupled between the gate and the source and the triggering device 1717-6 may be coupled between the drain and the gate. One should recognize that the triggering device 1717-6 may also be any other device suitable for triggering and the resistor 1717-5 may be any device suitable for building a voltage over to trigger the transistor 1717-4. Likewise, the transistor 1717-4 may be a bipolar transistor or other device which may be triggered to conduct a current. One should further recognize that trigger devices 1717, 1718, and 1719 may be a combination of any of the trigger device examples depicted in FIGS. 17c and 17d or may include any other combination of suitable trigger devices.

Figure 18A:
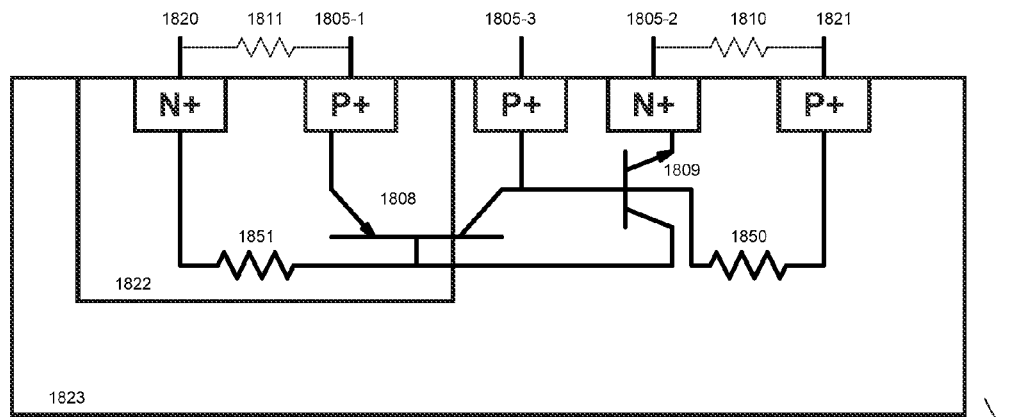
FIG. 18a is a cross-sectional view of an example of an SCR implementation of an ESD clamp.
Figure 18B:
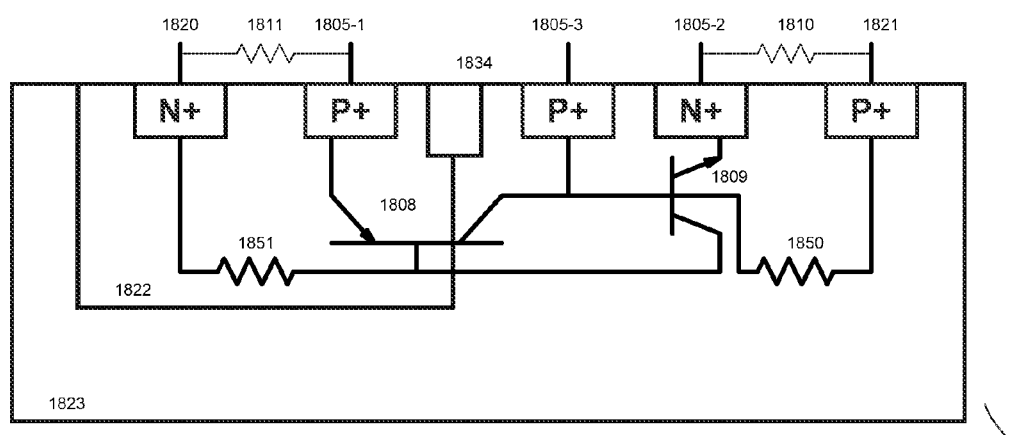
FIG. 18b is another cross-sectional view of an example of an SCR implementation of an ESD clamp including internal triggering.

FIG. 18a depicts the cross-section of an example of an SCR implementation of the ESD clamp 1805 as described for the embodiments disclosed herein. The anode 1805-1 may comprise a highly P doped region formed in a lowly N doped region 1822. The cathode 1805-2 may comprise a highly N doped region formed in a lowly P doped region 1823. The lowly N doped region 1822 may be formed in the lowly P doped region 1823. The PNP 1808 may be formed by the highly P doped anode 1805-1, the lowly N doped region 1822 and the lowly doped P doped region 1823, wherein the highly P doped region 1805-1 acts as the emitter, the lowly N doped region 1822 acts as the base, and the lowly P doped region 1823 acts as the collector. Highly P doped region 1805-3 may also act as the collector. The NPN 1809 may be formed by the highly N doped cathode 1805-2, the lowly P doped region 1823 and the lowly N doped region 1822, wherein the highly N doped region 1805-2 may act as the emitter, lowly P doped region 1823 may act as the base, and lowly N doped region 1822 may act as the collector. The G2 trigger tap may be formed by a highly N doped region 1820 inside the lowly N doped region 1822. The G2 trigger tap 1820 may be placed outside the region between the anode 1805-1 and the cathode 1805-2 as shown, for example, in FIG. 18a. The G1 trigger tap may be formed by a highly P doped region 1821 inside the lowly P doped region 1823. Alternative, the G1 trigger tap may not be present. The G1 trigger tap 1821 may be placed outside the region between the anode 1805-1 and the cathode 1805-2, as shown, for example, in FIG. 18a. The first control tap 1805-3 may be formed by a highly P doped region 1805-3 inside the lowly P doped region 1823. The first control tap 1805-3 may be placed inside the region between the anode 1805-1 and the cathode 1805-2. A resistance such as resistor 1811 may be coupled between G2 trigger tap 1820 and anode 1805-1. A resistance such as resistor 1810 may be coupled between G1 trigger tap 1821 and cathode 1805-2. A well resistance of well 1822 may exist, for example, between G2 trigger tap 1820 and the base of PNP transistor 1808. A well resistance may also exist between G1 trigger tap 1821 and the base of NPN transistor 1809. Though not depicted in FIG. 18a, the G2 trigger tap 1820 could be placed in line with the anode 1805-1. For example, the G2 trigger tap 1820 could be formed between 2 segments of the anode 1805-1. Furthermore, though not depicted in FIG. 18a, the G1 trigger tap 1821 could be placed in line with the cathode. For example, the G1 trigger tap 1821 could be formed between 2 segments of the cathode 1805-2. Furthermore, though not depicted in FIG. 18a, the highly P doped region 1805-3 may alternatively be placed outside the region between the anode 1805-1 and the cathode 1805-2. Resistances 1850 and 1851 as depicted in FIGS. 18a and 18b may represent a well resistances. Resistance 1851, for example, may be the intrinsic well resistance between trigger tap 1820 and the base of the PNP transistor. Resistance 1851 may be equivalently represented by resistor 1751 as shown in FIGS. 17a and 17b. Resistance 1850, as another example, may be the intrinsic well resistance between trigger tap 1821 and the base of the NPN transistor. Resistance 1850 may be equivalently represented by resistor 1750 as shown in FIGS. 17a and 17b. One may further note similar resistances 1950 and 1951 in FIGS. 19a and 19b. One should recognize that though FIG. 18a depicts a cross section of an ESD clamp implemented as an SCR, the ESD clamp may be implemented as other devices, such as one or more MOS device or bipolar transistor as further described herein above.

FIG. 18b depicts the cross-section of another exemplary SCR implementation of the ESD clamp 1805. The ESD clamp 1805 of FIG. 18b is similar as the ESD clamp 1805 depicted in FIG. 18a and may further include an additional internal trigger mechanism which may be implemented via the formation of Region 1834. As depicted by example in FIG. 18*b*, region 1834 may overlap the junction between the lowly N doped region 1822 and the lowly P doped region 1823 such that region 1834 may extend partially into region 1822 and may also extend partially into region 1823. Region 1834 may further be placed between the anode 1805-1 and the cathode 1805-2, or may alternatively be placed outside this region, or a combination of both. Region 1834 may be lowly or highly doped and may be P doped or N doped. The depth of the region 1834 may be the same or different as the other regions. Reverse breakdown of the junction around region 1834 may create avalanche current, which may trigger the ESD clamp. Alternatively the region 1834 may be placed completely inside lowly N doped region 1822. In this embodiment the region 1834 may be P doped and may be coupled to the cathode 1805-2. Alternatively the region 1834 may be placed completely inside lowly P doped region 1823. In this embodiment the region 1834 may be N doped and may be coupled to the anode 1805-1. As described above, the triggering of the SCR may be facilitated internally by any of the described configurations of the region 1834.

Figure 19A:
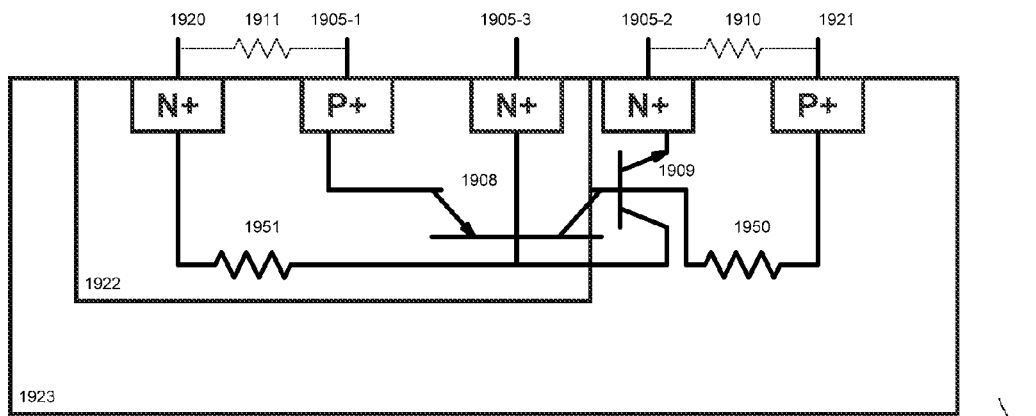
FIG. 19a is a cross-sectional view of another example of an SCR implementation of an ESD clamp.

FIG. 19*a* depicts the cross-section of another example of an SCR implementation of the ESD clamp 1905 as described for the embodiments disclosed herein. The anode 1905-1 may comprise a highly P doped region formed in a lowly N doped region 1922. The cathode 1905-2 may comprise a highly N doped region formed in a lowly P doped region 1923. The lowly N doped region 1922 may be formed in the lowly P doped region 1923. The PNP 1908 may be formed by the highly P doped anode 1905-1, the lowly N doped region 1922 and the lowly doped P doped region 1923, wherein the highly P doped region 1905-1 acts as the emitter, the lowly N doped region 1922 acts as the base, and the lowly P doped region 1923 acts as the collector. Highly P doped region 1905-3 may also act as the collector. The NPN 1909 may be formed by the highly N doped cathode 1905-2, the lowly P doped region 1923 and the lowly N doped region 1922, wherein the highly N doped region 1905-2 may act as the emitter, lowly P doped region 1923 may act as the base, and lowly N doped region 1922 may act as the collector. The G2 trigger tap may be formed by a highly N doped region 1920 inside the lowly N doped region 1922. Alternatively, the G2 trigger tap may not be present. The G2 trigger tap 1920 may be placed outside the region between the anode 1905-1 and the cathode 1905-2 as shown, for example, in FIG. 19*a*. The G1 trigger tap may be formed by a highly P doped region 1921 inside the lowly P doped region 1923. The G1 trigger tap 1921 may be placed outside the region between the anode 1905-1 and the cathode 1905-2 as shown, for example, in FIG. 19*a*. The first control tap 1905-3 may be formed by a highly N doped region 1905-3 inside the lowly N doped region 1922. The first control tap 1905-3 may be placed inside the region between the anode 1905-1 and the cathode 1905-2. A resistance such as resistor 1911 may be coupled between G2 trigger tap 1920 and anode 1905-1. A resistance such as resistor 1910 may be coupled between G1 trigger tap 1921 and cathode 1905-2. A well resistance of well 1922 may exist, for example, between G2 trigger tap 1920 and the base of PNP transistor 1908. A well resistance may also exist between G1 trigger tap 1921 and the base of NPN transistor 1909. Though not depicted in FIG. 19*a*, the G2 trigger tap 1920 could be placed in line with the anode 1905-1. For example, the G2 trigger tap 1920 could be formed between 2 segments of the anode 1905-1. Furthermore, though not depicted in FIG. 19*a*, the G1 trigger tap 1921 could be placed in line with the cathode. For example, the G1 trigger tap 1921 could be formed between 2 segments of the cathode 1905-2. Furthermore, though not depicted in FIG. 19*a*, the highly P doped region 1905-3 may be placed outside the region between the anode 1905-1 and the cathode 1905-2. One should recognize that though FIG. 19*a* depicts a cross section of an ESD clamp implemented as an SCR, the ESD clamp may be implemented as other devices, such as one or more MOS device or bipolar transistor as further described herein above.

Figure 19B:
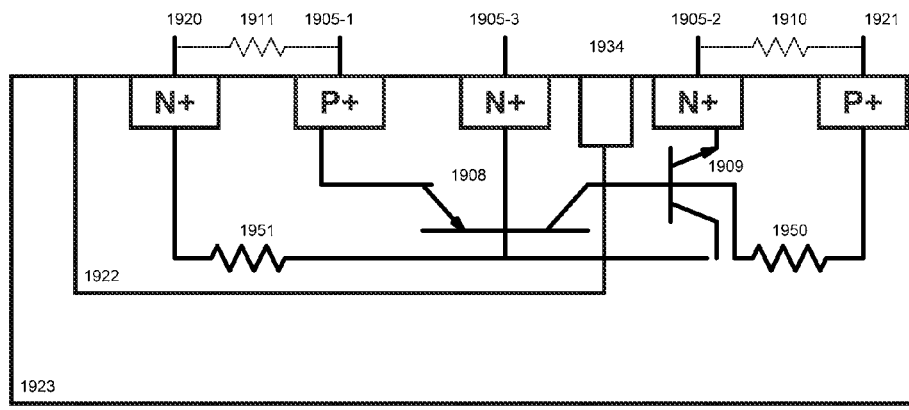
FIG. 19b is another cross-sectional view of another example of an SCR implementation of an ESD clamp including internal triggering.

FIG. 19*b* depicts the cross-section of another exemplary SCR implementation of the ESD clamp 1905. The ESD clamp 1905 of FIG. 19*b* is similar as the ESD clamp 1905 depicted in FIG. 19*a* and may further include an additional internal trigger mechanism which may be implemented via the formation of Region 1934. As depicted by example in FIG. 19*b*, region 1934 may overlap the junction between the lowly N doped region 1922 and the lowly P doped region 1923 such that region 1934 may extend partially into region 1922 and may also extend partially into region 1923. Region 1934 may further be placed between the anode 1905-1 and the cathode 1905-2, or may alternatively be placed outside this region, or a combination of both. Region 1934 may be lowly or highly doped and may be P doped or N doped. The depth of the region 1934 may be the same or different as the other regions. Reverse breakdown of the junction around region 1934 may create avalanche current, which may trigger the ESD clamp. Alternatively the region 1934 may be placed completely inside lowly N doped region 1922. In this embodiment the region 1934 may be P doped and may be coupled to the cathode 1905-2. Alternatively the region 1934 may be placed completely inside lowly P doped region 1923. In this embodiment the region 1934 may be N doped and may be coupled to the anode 1905-1. As described above, the triggering of the SCR may be facilitated internally by any of the described configurations of the region 1934.

It may be useful to isolate the ESD protection devices from the substrate. This can be done to prevent the formation of unwanted parasitic or to allow stacking of different devices. By way of example, FIG. 20 and FIG. 21 show possible ways to isolate the devices from the substrate.

Figure 20:
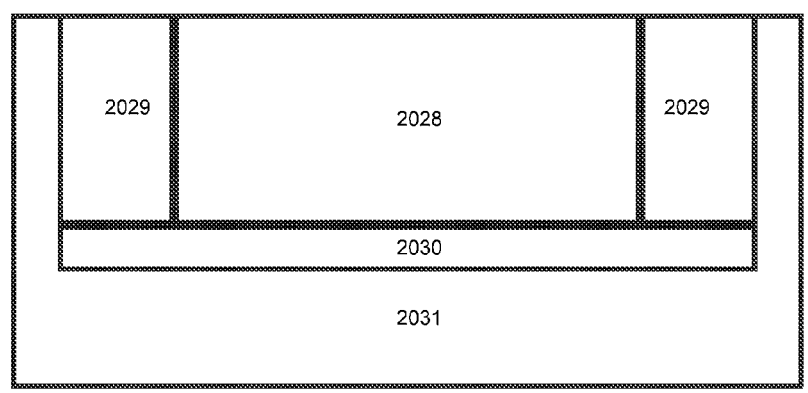
FIG. 20 is a cross-sectional view of a first example of a form of isolation that may be used in conjunction with an ESD protection device.

FIG. 20 shows a cross section of a first example of isolation which may be used in conjunction with any embodiment of an ESD protection device. The device 2028 may comprise, for example, any of the devices depicted in FIGS. 18*a*, 18*b*, 19*a* and 19*b*. A ring 2029 may be formed around the device 2028. Note that FIG. 20 is a cross section view, hence ring 2029 is depicted as two regions, but may be a single ring when viewed from above. Also a buried layer 2030 may be placed beneath at least a portion of the device 2028 and/or the ring region(s) 2029. Such a configuration may isolate the device 2028 from the substrate 2031. The regions 2029 and 2030 may be of a first dopant type, for example N-type, and region 2031 may be of a second dopant type opposite of the first dopant type, for example P-type. One should recognize that the isolation provided by the example cross section of FIG. 20 may be combined with any of the embodiments or combination of embodiments disclosed herein.

Figure 21:
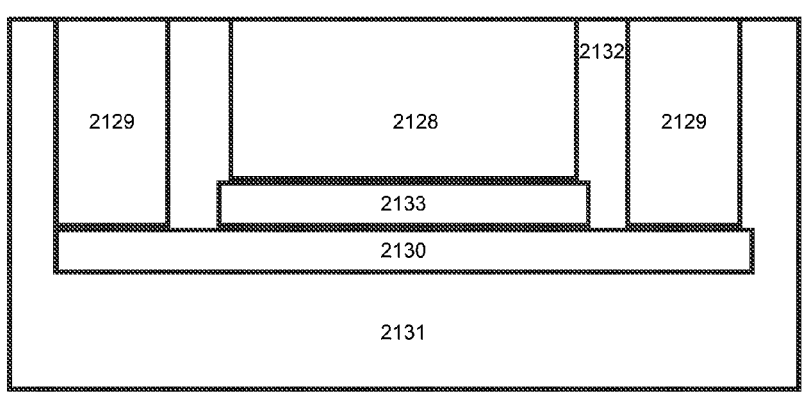
FIG. 21 is a cross-sectional view of a second example of a form of isolation that may be used in conjunction with an ESD protection device.

FIG. 21 shows a cross section of a second example of isolation which may be used in conjunction with any embodiment of an ESD protection device. The device 2128 may comprise, for example, any of the ESD protection devices depicted in FIGS. 18*a*, 18*b*, 19*a*, and 19*b*. A first ring 2129 may be formed around the device 2128. Note that FIG. 21 is a cross section view, hence ring 2129 is depicted as two regions, but may be a single ring when viewed from above. Also a first buried layer 2130 may be placed beneath at least a portion of the device 2128 and/or the region(s) 2129. A second ring 2132 may be formed between at least a portion of the first ring 2129 and the device 2128, and a second buried layer 2133 may be formed between at least a portion of the device 2128 and the first buried layer 2130. Such a configuration may isolate the device 2128 from the substrate 2131. The regions 2129 and 2130 may be of the first dopant type, for example N-type, and the regions 2131, 2133 and 2132 may be of the second dopant type, for example P-type. Region 2129 may be coupled to the anode 2105-1, to the anode 2101, or in general to any high voltage node. Region 2131 may be coupled to the cathode 2105-2, to the cathode 2102, or in general to any low voltage node. Region 2132 may be coupled to the cathode 2105-2 or to the cathode 2102. One should recognize that the isolation provided by the example cross section of FIG. 21 may be combined with any of the embodiments or combination of embodiments disclosed herein.

The isolation techniques described above are only 2 examples, other techniques known by those skilled in the art could also be implemented. For instance, in processes like silicon-on-insulator (SOI), isolation can be done using oxide layers.

It should be recognized that the relative geometries, dimensions, and orientations depicted in the Figures are examples. Other relative geometries, dimensions, and orientations for regions and devices depicted may be implemented and are within the scope of the teachings disclosed herein.

In some configurations, the control tap 2205-3 may be pulled too low, so that the ESD clamp 2205 may be prevented from triggering. FIGS. 22 to 27 depict some examples of embodiments of ESD protection devices configured with aided triggering.

Figure 22A:
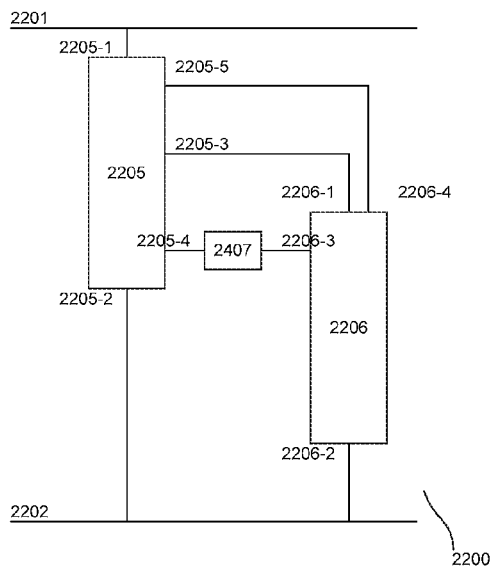
FIG. 22a is a schematic diagram of another embodiment of an ESD protection device with aided triggering and including a holding voltage tuning circuit.

FIG. 22a depicts an example of an embodiment of an ESD protection device 2200 including aided triggering. The holding voltage tuning circuit 2206 includes an additional trigger control node 2206-4 to provide an extra trigger current to the ESD clamp 2205. The ESD clamp 2205 may receive this additional trigger signal through a trigger node 2205-5. When the holding voltage tuning circuit 2206 is turned on, an extra current may also flow from the trigger node 2205-5 towards the cathode 2202. This extra triggering mechanism may help the ESD clamp 2205 to turn on or to stay on.

Figure 22B:
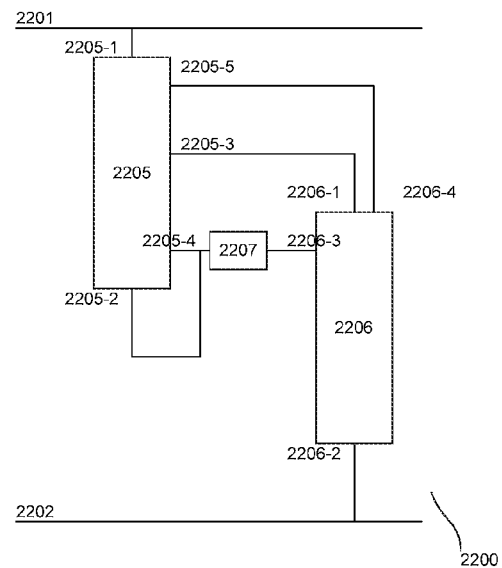
FIG. 22b is a schematic diagram of another embodiment of an ESD protection device with aided triggering and including a holding voltage tuning circuit.
Figure 22C:
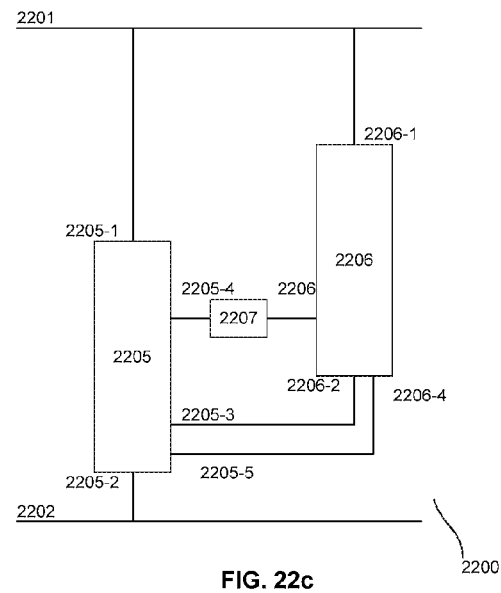
FIG. 22c is a schematic diagram of another embodiment of an ESD protection device with aided triggering and including a holding voltage tuning circuit.
Figure 22D:
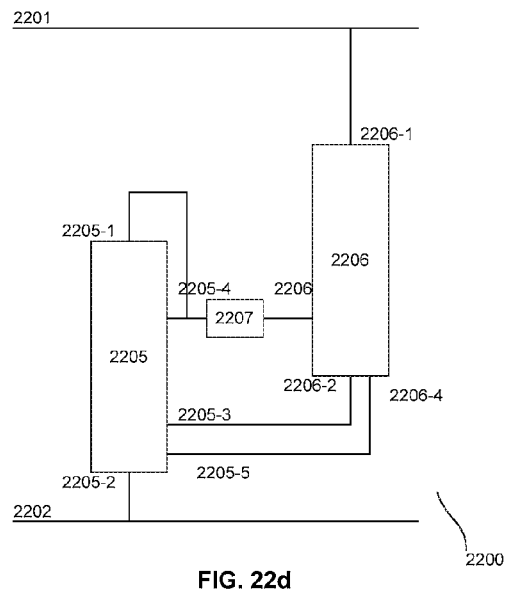
FIG. 22d is a schematic diagram of another embodiment of an ESD protection device with aided triggering and including a holding voltage tuning circuit.

FIGS. 22b, 22c, and 22d depict additional examples of embodiments of an ESD protection device 2200 including aided triggering. In FIG. 22b, the cathode 2205-2 of ESD clamp 2205 may be coupled to the second control tap 2205-4 or may act as the second control tap 2205-4. The embodiments depicted in FIGS. 22c and 22d also exhibit the additional trigger node 2205-5 and additional trigger control node 2206-4 wherein the anode 2206-1 of the holding voltage tuning circuit 2206 is coupled to the ESD protection device anode 2201. One should recognize that an ESD protection device including aided triggering in accordance with the principles taught with respect to FIGS. 22a-22d may be combined with any of the other embodiments disclosed herein.

Figure 23A:
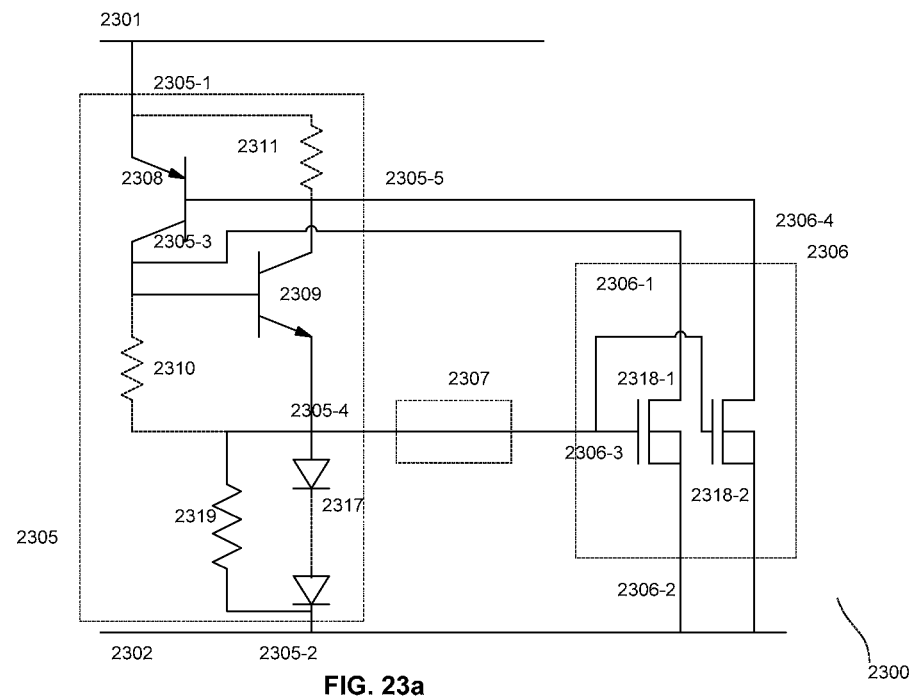
FIG. 23a is a schematic diagram of another embodiment of an ESD protection device with aided triggering and including a holding voltage tuning circuit.

FIG. 23a depicts another embodiment of an ESD protection device 2300 including an additional trigger control node 2306-4 to help the ESD clamp 2305 to turn on or to stay on. The holding voltage tuning circuit 2306 may comprise a first MOS transistor 2318-1 and a second MOS transistor 2318-2. The gate of the first MOS transistor 2318-1 may be coupled to the gate of the second MOS transistor 2318-2. The source/bulk of the first MOS transistor 2318-1 may be coupled to the source/bulk of the second MOS transistor 2318-2. The drain of the first MOS transistor 2318-1 may be coupled to the first control tap 2305-3. The drain of the second MOS transistor 2318-2 may be coupled to the additional trigger node 2305-5 which may be coupled to the G2 trigger tap (formed in the base well of the PNP 2308) of the SCR formed by PNP 2308 and NPN 2309. First MOS transistor 2318-1 and second MOS transistor 2318-2 may be two separate, physical MOS transistors or may be implemented as one MOS transistor with multiple fingers, wherein some of the fingers may be coupled to anode 2306-1 and some of the fingers may be coupled to the additional trigger control node 2306-4. When the first MOS transistor 2318-1 is turned on, the first control tap 2305-3 may be pulled low. Also, the second MOS transistor 2318-2 may also turn on, which may provide extra trigger current to turn on the ESD protection 2305 device. One should recognize that an ESD protection device including added triggering implemented through two MOS transistors in accordance with the principles taught with respect to FIG. 23a may be combined with any of the other embodiments disclosed herein. Furthermore, the MOS transistors may be NMOS or PMOS transistors, or a combination of NMOS and PMOS. The transistors may also be implemented as two bipolar transistors, which may each be either an NPN transistor or a PNP transistor. Furthermore, though ESD protection device 2300 is depicted including elements 2317 and 2319, these elements may be eliminated. Furthermore, for example, the principles of the ESD protection devices 300 in FIGS. 3a and 3b may be applied to the example shown in FIG. 23a to implement aided triggering for ESD protection devices in accordance with the embodiments shown in FIGS. 3a and 3b.

Figure 23B:
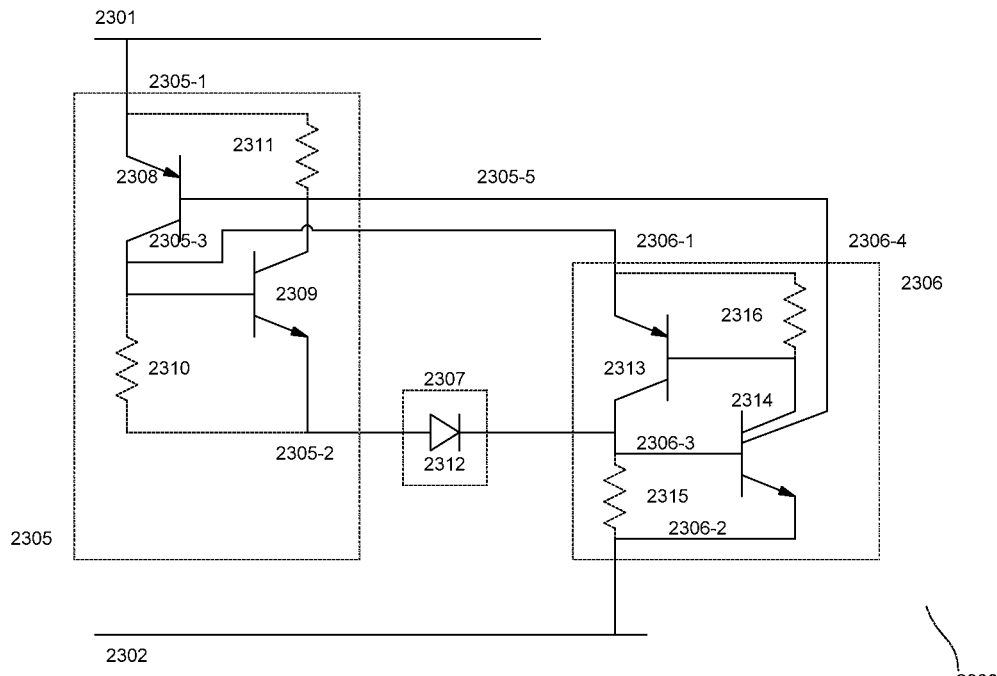
FIG. 23b is a schematic diagram of another embodiment of an ESD protection device with aided triggering and including a holding voltage tuning circuit.

FIG. 23b depicts another embodiment of an ESD protection device 2300 including an additional trigger control node 2306-4 to help the ESD clamp 2305 to turn on or to stay on. The NPN 2314 of the holding voltage tuning circuit 2306 may have an additional collector which may be coupled through the additional trigger control node 2306-4 to the additional trigger node 2305-5 (formed in the base well of the NPN 2308) of the ESD clamp 2305. One should recognize that, like for FIG. 23a, the aided triggering shown in FIG. 23b may be similarly applied to or in combination with any of the other embodiments disclosed herein. For example, the principles of the ESD protection devices 300 in FIGS. 3a and 3b may be applied to the example shown in FIG. 23b to implement aided triggering for ESD protection devices in accordance with the embodiments shown in FIGS. 3a and 3b.

FIGS. 24a-24d depict examples of embodiments of an ESD protection device 2400 including additional triggering aid of the ESD clamp 2405. A keep-off circuit 2424 may prevent the holding voltage tuning circuit 2406 from pulling down/up the first control tap 2405-3 during certain conditions. One of these conditions may be defined by a transient detection circuit so that only after a certain time the holding voltage tuning circuit 2406 may turn on. This may enable the ESD protection device 2405 to trigger before the holding voltage tuning circuit 2406 turns on. Other conditions may be that the holding voltage tuning circuit 2406 may only be allowed to conduct current/turn on below a certain voltage.

Figure 24A:
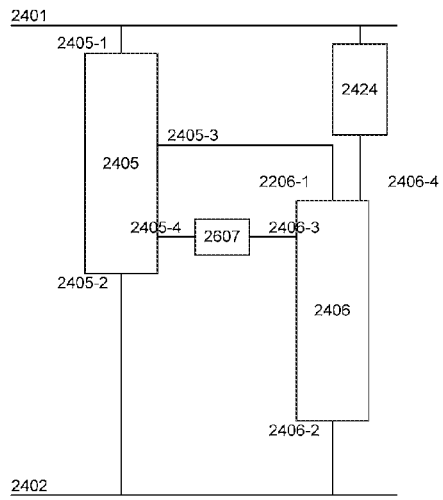
FIG. 24a is a schematic diagram of another embodiment of an ESD protection device including a holding voltage tuning circuit with a keep-off circuit.
Figure 24B:
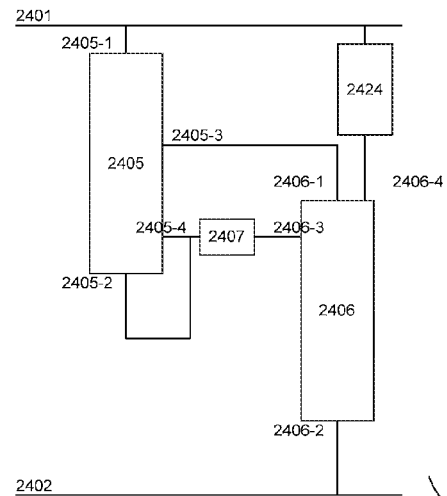
FIG. 24b is a schematic diagram of another embodiment of an ESD protection device including a holding voltage tuning circuit with a keep-off circuit.
Figure 24C:
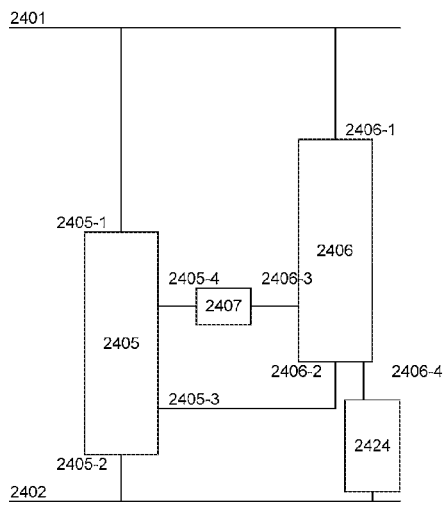
FIG. 24c is a schematic diagram of another embodiment of an ESD protection device including a holding voltage tuning circuit with a keep-off circuit.
Figure 24D:
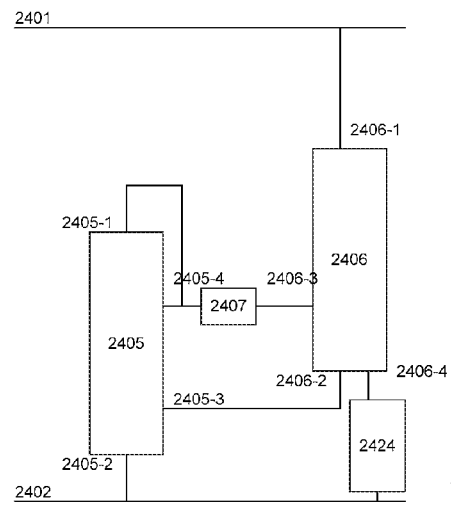
FIG. 24d is a schematic diagram of another embodiment of an ESD protection device including a holding voltage tuning circuit with a keep-off circuit.

FIGS. 24a and 24b depict examples of embodiments of an ESD protection device 2400 including a keep-off circuit 2424 wherein the keep-off circuit 2424 is coupled between the anode 2401 of the ESD protection device 2400 and the additional trigger control node 2406-4 of the holding voltage tuning circuit 2406. FIGS. 24c and 24d depict examples of embodiments of an ESD protection device 2400 including a keep-off circuit 2424 wherein the keep-off circuit 2424 is coupled between the cathode 2402 of the ESD protection device 2400 and the additional trigger control node 2406-4 of the holding voltage tuning circuit 2406. One should recognize that an ESD protection device including keep-off circuit 2424 in accordance with the principles taught with respect to FIGS. 24a-24d may be combined with any of the other embodiments disclosed herein.

Figure 25:
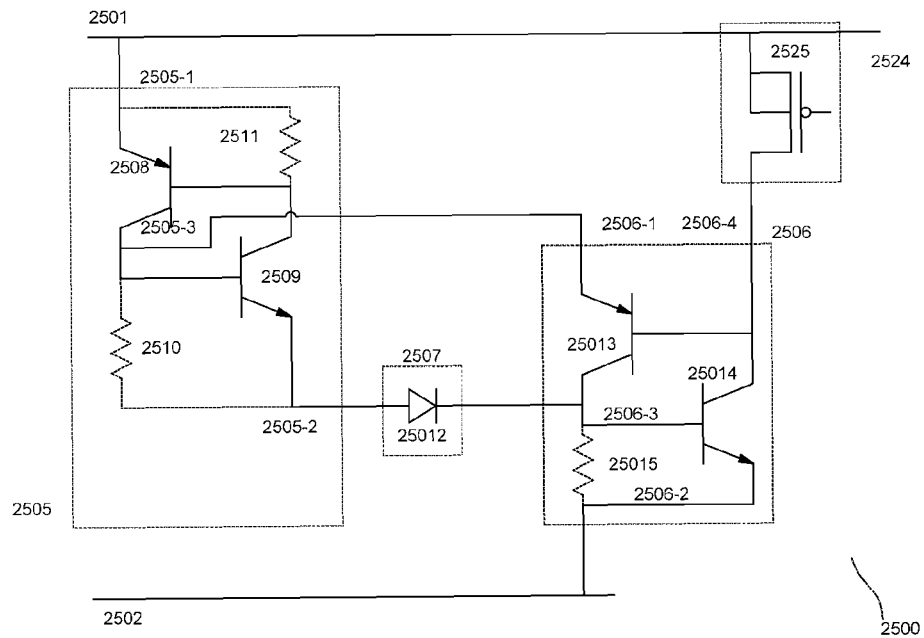
FIG. 25 is a schematic diagram of another embodiment of an ESD protection device including a holding voltage tuning circuit with a keep-off circuit.

FIG. 25 depicts an example of an implementation of an embodiment of an ESD protection device 2500 including a keep-off circuit 2524. The base of the PNP 2513 may be pulled towards the anode 2501 through the keep off circuit 2524. The keep off circuit 2524 may comprise a PMOS transistor 2525. The gate of the PMOS transistor 2525 may be coupled to a detection circuit, for example a transient detection circuit or voltage detection circuit (not depicted in FIG. 25). When the PMOS 2525 is turned on, the base of the PNP 2513 will be pulled above the emitter of the PNP 2513. This may prevent the PNP 2513 from turning on. After the PMOS 2525 had been turned off, the holding voltage tuning circuit 2506 may turn on and pull the first control tap 2505-3 low. Though the keep-off circuit 2524 is depicted as a PMOS transistor 2525 in FIG. 25, it may alternatively be implemented, for example, as at least one of an NMOS transistor, a resistor, an inductor, a capacitor, a bipolar transistor, or any combination thereof. One should recognize that though the embodiment shown in FIG. 25 may most closely resemble the configuration of the embodiment shown in FIG. 24b, one may apply the principles of the example shown in FIG. 25 to any of the other embodiments shown in FIGS. 24a, 24c, and 24d. Moreover, one should recognize that a keep-off circuit may be combined with any of the other embodiments disclosed herein.

Figure 26A:
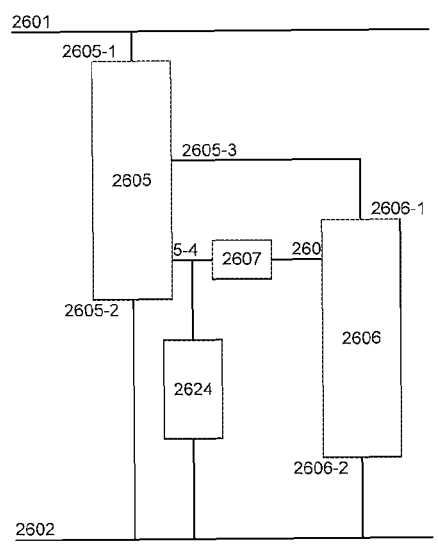
FIG. 26a is a schematic diagram of another embodiment of an ESD protection device including a holding voltage tuning circuit with a keep-off circuit.
Figure 26B:
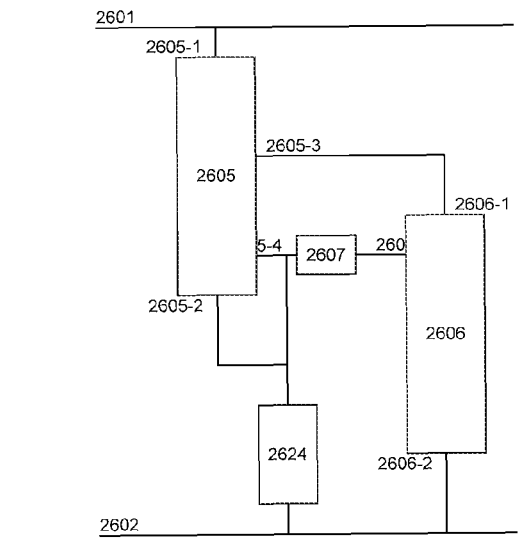
FIG. 26b is a schematic diagram of another embodiment of an ESD protection device including a holding voltage tuning circuit with a keep-off circuit.
Figure 26C:
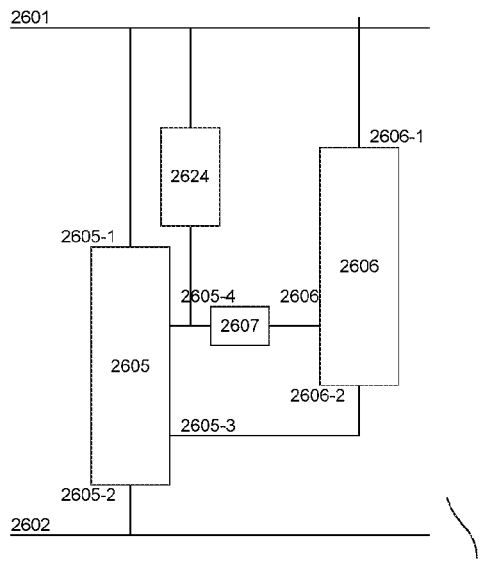
FIG. 26c is a schematic diagram of another embodiment of an ESD protection device including a holding voltage tuning circuit with a keep-off circuit.
Figure 26D:
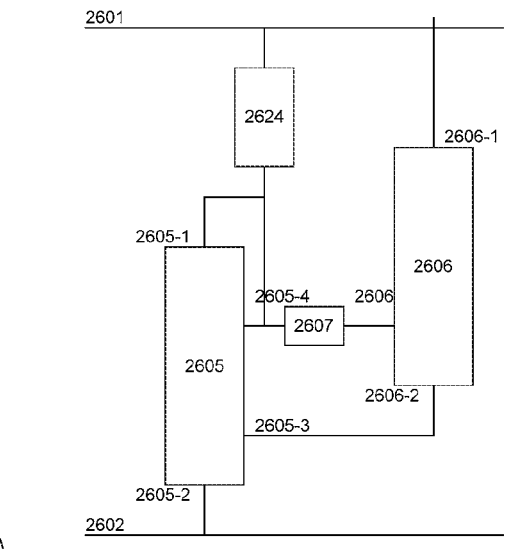
FIG. 26d is a schematic diagram of another embodiment of an ESD protection device including a holding voltage tuning circuit with a keep-off circuit.

FIGS. 26a-26d depict additional examples of embodiments of an ESD protection device 2600 including additional triggering aid of the ESD clamp 2605. FIGS. 26a and 26b include a keep-off circuit 2624, which may prevent the holding voltage tuning circuit 2606 from pulling down the first control tap 2605-3 during certain conditions. FIGS. 26c and 26d include a keep-off circuit 2624, which may prevent the holding voltage tuning circuit 2606 from pulling up the first control tap 2605-3 during certain conditions. One of these conditions may be defined by a transient detection circuit so that only after a certain time the holding voltage tuning circuit may turn on. This may enable the ESD clamp 2605 to trigger before the holding voltage tuning circuit 2606 turns on. Other conditions may be that the holding voltage tuning circuit 2606 may only be allowed to conduct current/turn on below a certain voltage. The keep off circuit 2624 may pull some current away from the holding voltage tuning circuit 2606 so that the holding voltage tuning circuit 2606 may not trigger. One should recognize that an ESD protection device including additional keep-off circuit 2624 in accordance with the principles taught with respect to FIGS. 26a-26d may be combined with any of the other embodiments disclosed herein.

Figure 27:
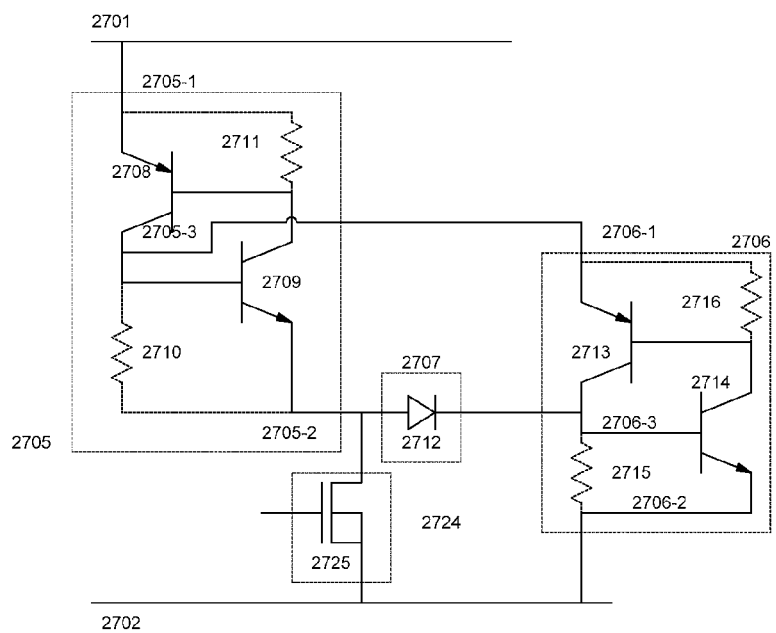
FIG. 27 is a schematic diagram of another embodiment of an ESD protection device including a holding voltage tuning circuit with a keep-off circuit.

FIG. 27 depicts another example of an implementation of an ESD protection device 2700 including a keep-off circuit 2724. The keep-off circuit 2724 may be implemented as an NMOS transistor 2725 as shown in FIG. 27 and may prevent current from flowing towards the holding voltage tuning circuit 2706 through the connection circuit 2707. By pulling the drain of the NMOS transistor 2725 towards the cathode 2702, the diode 2712 of the connection circuit 2707 may be reversed biased and so may prevent current flow to the holding voltage tuning circuit 2706. The gate of the NMOS transistor may be controlled by, for example, a voltage detection circuit or transient detection circuit (not depicted in the Figure). The NMOS transistor 2725 may be turned on, for instance during a transient condition. The keep-off circuit 2724, i.e. NMOS 2725, may be turned-off otherwise to allow the holding voltage turning circuit 2706 to trigger. Though the keep-off circuit 2724 is depicted as a NMOS transistor 2725 in FIG. 27, it may alternatively be implemented, for example, as at least one of a PMOS transistor, a resistor, an inductor, a capacitor, a bipolar transistor, or any combination thereof. One should recognize that though the embodiment shown in FIG. 27 may most closely resemble the configuration of the embodiment shown in FIG. 26b, one may apply the principles of the example shown in FIG. 27 to any of the other embodiments shown in FIGS. 26a, 26c, and 26d. Moreover, one should recognize that an additional keep-off circuit in accordance with that shown in FIGS. 26a-26d and 27 may be combined with any of the other embodiments disclosed herein.

It should be recognized that the relative geometries, dimensions, and orientations depicted in the Figures are examples. Other relative geometries, dimensions, and orientations for regions and devices depicted may be implemented and are within the scope of the teachings disclosed herein. Further, it should be noted that though the terms "first" and "second" are used throughout the description, reference to a "second" device does not require the presence of a "first" device. Rather, the terms "first" and "second" are merely used as modifiers to distinguish one device from another. For example, an ESD protection device may be described as including a second diode without necessarily having a first diode such that there is only one diode in the example. This nomenclature applies to any elements, nodes, devices, or otherwise that are described herein and may be further applied to "third", "fourth", etc. without requiring the presence of three or four devices, respectively.

What is claimed is:

1. An electrostatic discharge (ESD) protection device coupled between a first node and a second node, comprising:
   a first silicon controlled rectifier (SCR) including a first PNP transistor and a first NPN transistor, the first SCR further including a first anode electrically coupled to the first node, a first cathode, and a first control tap electrically coupled to a base of the first NPN transistor;
   a holding voltage tuning circuit including a transistor, wherein the holding voltage tuning circuit further includes a second anode, a second cathode, and a first control node, wherein the second anode is directly electrically connected to the first control tap, and the second cathode is directly electrically connected to the second node;
   a connection circuit electrically coupled between the first cathode and the first control node; and
   an electrical element electrically coupled between the first cathode and the second node, wherein a voltage is dropped across the electrical element during an ESD event;
   wherein the ESD protection device is configured to trigger during the ESD event to protect circuitry between the first node and the second node.

2. The ESD protection device of claim 1, wherein the connection circuit includes at least one diode.

3. The ESD protection device of claim 1, wherein the ESD protection device further comprises a first triggering device, wherein the first SCR further includes a first trigger tap, wherein the first trigger tap is electrically coupled to the base of the first NPN transistor, and wherein the first triggering device is electrically coupled between the first node and the first trigger tap.

4. The ESD protection device of claim 1, wherein the ESD protection device further comprises a second triggering device, wherein the first SCR further includes a second trigger tap, wherein the second trigger tap is electrically coupled to a base of the first PNP transistor, and wherein the second triggering device is electrically coupled between the second node and the second trigger tap.

5. The ESD protection device of claim 1, wherein the ESD protection device further comprises a third triggering device, wherein the first SCR further includes a first trigger tap and a second trigger tap, wherein the first trigger tap is electrically coupled to the base of the first NPN transistor, wherein the second trigger tap is electrically coupled to a base of the first PNP transistor, and wherein the third triggering device is electrically coupled between the first trigger tap and the second trigger tap.

6. The ESD protection device of claim 1, wherein the electrical element comprises one or more serially coupled, forward-biased diodes electrically coupled between the first cathode and the second node.

7. The ESD protection device of claim 6, further comprising a resistor in parallel with the one or more serially coupled, forward-biased diodes.

8. The ESD protection device of claim 6, wherein the transistor of the holding voltage tuning circuit is a first NMOS transistor.

9. The ESD protection device of claim 8, wherein a drain of the first NMOS transistor is electrically coupled to the second anode, a gate of the first NMOS transistor is electrically coupled to the first control node, and a source of the first NMOS transistor is electrically coupled to the second cathode.

10. The ESD protection device of claim 8, further comprising one or more serially coupled, forward-biased diodes electrically coupled between an emitter of the first NPN transistor and the first cathode.

11. The ESD protection device of claim 1, wherein the first SCR further includes a second control tap, and wherein the ESD protection device further comprises:
 a second holding voltage tuning circuit including a third anode, a third cathode, and a second control node, wherein the third anode is electrically coupled to the first node, and the third cathode is electrically coupled to the second control tap; and
 a second connection circuit electrically coupled between the second control node and the first anode.

12. The ESD protection device of claim 11, wherein the second control tap is electrically coupled to a base of the first PNP transistor.

13. The ESD protection device of claim 12, wherein the second connection circuit includes at least one diode.

14. The ESD protection device of claim 1, wherein the holding voltage tuning circuit further includes a third anode, wherein the first SCR further includes a second control tap, and wherein the third anode is electrically coupled to the second control tap.

15. The ESD protection device of claim 14, wherein the transistor of the holding voltage tuning circuit is a first NMOS transistor, wherein a drain of the first NMOS transistor is electrically coupled to the second anode, a gate of the first NMOS transistor is electrically coupled to the first control node, and a source of the first NMOS transistor is electrically coupled to the second cathode, and wherein the holding voltage tuning circuit further includes a second NMOS transistor, wherein a gate of the second NMOS transistor is electrically coupled to the first control node, a source of the second NMOS transistor is electrically coupled to the second cathode, wherein a drain of the second NMOS transistor is electrically coupled to the third anode, and wherein the second control tap is electrically coupled to a base of the PNP transistor.

16. The ESD protection device of claim 1, wherein the first control tap is a first highly-doped P region, and wherein the first control tap is disposed between the first anode and the first cathode.

17. The ESD protection device of claim 16, wherein the first control tap is formed in a lowly-doped P region, wherein the first cathode is a highly-doped N region, and wherein the base of the first NPN transistor is formed by at least a portion of the lowly-doped P region.

18. The ESD protection device of claim 17, wherein the first anode is a second highly-doped P region formed within a lowly-doped N region, wherein the first control tap is disposed between the first cathode and a PN junction formed by the lowly-doped N region and the lowly-doped P region.

19. The ESD protection device of claim 3, wherein the first trigger tap is the first control tap.

20. The ESD protection device of claim 5, wherein the first trigger tap is the first control tap.

21. The ESD protection device of claim 9, wherein the first SCR further includes a first resistance electrically coupled between the base of the first NPN transistor and the first cathode.

22. The ESD protection device of claim 20, wherein the first SCR further includes a second resistance electrically coupled between a base of the first PNP transistor and the first anode.

23. The ESD protection device of claim 1, further comprising a keep-off circuit electrically coupled between the holding voltage tuning circuit and the first node.

24. The ESD protection device of claim 1, further comprising a keep-off circuit electrically coupled between the first cathode and the second node, wherein the keep-off circuit is configured to prevent the holding voltage tuning circuit from pulling down the first control tap until after a delay following a detected transient.

* * * * *